US009223207B2

(12) United States Patent
Sakakibara et al.

(10) Patent No.: US 9,223,207 B2
(45) Date of Patent: Dec. 29, 2015

(54) RESIST PATTERN-FORMING METHOD, AND RADIATION-SENSITIVE RESIN COMPOSITION

(71) Applicant: JSR CORPORATION, Tokyo (JP)

(72) Inventors: Hirokazu Sakakibara, Tokyo (JP); Taiichi Furukawa, Tokyo (JP); Masafumi Hori, Tokyo (JP); Koji Ito, Tokyo (JP); Hiromu Miyata, Tokyo (JP)

(73) Assignee: JSR CORPORATION, Tokyo (JP)

( * ) Notice: Subject to any disclaimer, the term of this patent is extended or adjusted under 35 U.S.C. 154(b) by 0 days.

(21) Appl. No.: 13/940,119

(22) Filed: Jul. 11, 2013

(65) Prior Publication Data

US 2013/0295506 A1    Nov. 7, 2013
US 2014/0363766 A9    Dec. 11, 2014

Related U.S. Application Data

(63) Continuation of application No. PCT/JP2011/079736, filed on Dec. 21, 2011.

(30) Foreign Application Priority Data

Jan. 28, 2011 (JP) .................................. 2011-016814

(51) Int. Cl.
| | | |
|---|---|---|
| *G03F 7/004* | (2006.01) | |
| *G03F 7/38* | (2006.01) | |
| *G03F 7/20* | (2006.01) | |
| *G03F 7/039* | (2006.01) | |
| *G03F 7/32* | (2006.01) | |

(52) U.S. Cl.
CPC ............ *G03F 7/0041* (2013.01); *G03F 7/0045* (2013.01); *G03F 7/0046* (2013.01); *G03F 7/0397* (2013.01); *G03F 7/20* (2013.01); *G03F 7/2041* (2013.01); *G03F 7/325* (2013.01); *G03F 7/38* (2013.01)

(58) Field of Classification Search
CPC .................................. G03F 7/38; G03F 7/0397
USPC ....................... 430/270.1, 325, 330, 910, 907
See application file for complete search history.

(56) References Cited

U.S. PATENT DOCUMENTS

| | | | | |
|---|---|---|---|---|
| 4,743,529 A | * | 5/1988 | Farid et al. .................. | 430/281.1 |
| 4,910,122 A | | 3/1990 | Arnold et al. | |
| 7,799,507 B2 | * | 9/2010 | Endo et al. .................. | 430/270.1 |
| 8,318,403 B2 | * | 11/2012 | Ichikawa .............. | C07C 309/17 |
| | | | | 430/270.1 |
| 2009/0263742 A1 | * | 10/2009 | Fuji et al. .................... | 430/270.1 |
| 2009/0269695 A1 | * | 10/2009 | Fuji et al. .................... | 430/270.1 |
| 2011/0027716 A1 | * | 2/2011 | Yamaguchi ........... | C07C 309/06 |
| | | | | 430/270.1 |
| 2011/0294069 A1 | * | 12/2011 | Bae et al. ................... | 430/283.1 |
| 2012/0237874 A1 | * | 9/2012 | Yamaguchi ........... | C07C 309/06 |
| | | | | 430/281.1 |

FOREIGN PATENT DOCUMENTS

| | | |
|---|---|---|
| JP | 06-12452 B2 | 5/1984 |
| JP | 59-93448 | 5/1984 |
| JP | 05-188598 | 7/1993 |
| JP | 2000-199953 | 7/2000 |
| JP | 2005-352384 | 12/2005 |
| JP | 2009-025723 | 2/2009 |
| JP | 2010-072273 | 4/2010 |
| JP | 2010-164958 | 7/2010 |
| JP | 2011-248019 | 12/2011 |
| JP | 2012-032782 A | 2/2012 |
| TW | 200839467 A | 10/2008 |
| TW | 200918495 A | 5/2009 |
| TW | 201202849 A1 | 1/2012 |
| WO | WO 2009/051088 | 4/2009 |

OTHER PUBLICATIONS

International Search Report for corresponding International Application No. PCT/JP2011/079736, Jan. 24, 2012.
Office Action issued May 29, 2015, in Taiwan Patent Application No. 101102671 (w/ English translation).
Office Action issued Jun. 16, 2015, in Japanese Patent Application No. 2012-554648 (w/ English translation).

* cited by examiner

*Primary Examiner* — John S Chu
(74) *Attorney, Agent, or Firm* — Oblon, McClelland, Maier & Neustadt, L.L.P.

(57) ABSTRACT

A resist pattern-forming method includes forming a resist coating film using a radiation-sensitive resin composition. The resist coating film is exposed and developed using a developer solution containing no less than 80% by mass of an organic solvent. The radiation-sensitive resin composition includes a polymer component including a polymer having an acid-labile group, and a radiation-sensitive acid generator. The polymer component includes, in an identical polymer or different polymers, a first structural unit having a first hydrocarbon group, and a second structural unit having a second hydrocarbon group. The first hydrocarbon group is an unsubstituted or substituted branched chain group, or the like. The second hydrocarbon group has an adamantane skeleton. A molar ratio of the second hydrocarbon group to the first hydrocarbon group is less than 1. A proportion of a structural unit having a hydroxyl group in the polymer component is less than 5 mol %.

22 Claims, No Drawings

RESIST PATTERN-FORMING METHOD, AND RADIATION-SENSITIVE RESIN COMPOSITION

CROSS-REFERENCE TO RELATED APPLICATIONS

The present application is a continuation application of International Application No. PCT/JP2011/079736, filed Dec. 21, 2011, which claims priority to Japanese Patent Application No. 2011-016814, filed Jan. 28, 2011. The contents of these applications are incorporated herein by reference in their entirety.

BACKGROUND OF THE INVENTION

1. Field of the Invention

The present invention relates to a resist pattern-forming method, and a radiation-sensitive resin composition.

2. Discussion of the Background

Miniaturization of structures of various types of electronic devices such as semiconductor devices and liquid crystal devices has been accompanied by demands for miniaturization of resist patterns in lithography processes, and formation of fine resist patterns having a line width of about 90 nm using an ArF excimer laser that is a radioactive ray with a short wavelength has been investigated. Various compositions for resist capable of responding to radioactive rays having such short wavelengths have been studied. As such a composition for resist, a radiation-sensitive resin composition has been known which generates an acid at light-exposed sites by irradiation with a radioactive ray (i.e., exposure), and a catalytic action of the acid allows the difference in dissolution rates in developing solutions to be produced between the light-exposed site and the light-unexposed site, thereby enabling a resist patterns to be formed on a substrate.

On the other hand, as a technique for increasing a resolving power using a preexisting apparatus without increasing steps by utilizing characteristic features of such radiation-sensitive resin compositions, a technique in which an organic solvent having polarity lower than that of aqueous alkali solutions is used as a developer solution has been known (see Japanese Unexamined Patent Application, Publication No. 2000-199953). Attaining a high optical contrast is enabled when an organic solvent is used in this manner, and as a result, a fine pattern can be formed.

When a conventional radiation-sensitive resin composition is used in such a resist pattern-forming method in which an organic solvent is used as a developer solution, a film loss may be caused after resist pattern formation on the surface at light-exposed sites, resulting from use of an organic solvent as a developer solution. On the other hand, at light-exposed sites, a disadvantage of impaired etching resistance may also occur due to a decrease in the carbon content. Thus, achieving both superior etching resistance and inhibition of the film loss has been reportedly difficult. In addition, when the film loss is caused, improvement of lithography characteristics involving CDU (Critical Dimension Uniformity), MEEF (Mask Error Enhancement Factor) and resolution in fine regions, etc., has been difficult, which may result from the film loss. Accordingly, a radiation-sensitive resin composition and a resist pattern-forming method capable of improving these characteristics has been demanded.

SUMMARY OF THE INVENTION

According to one aspect of the present invention, a resist pattern-forming method includes forming a resist coating film using a radiation-sensitive resin composition. The resist coating film is exposed. The exposed resist coating film is developed using a developer solution containing no less than 80% by mass of an organic solvent. The radiation-sensitive resin composition includes a polymer component including a polymer having an acid-labile group, and a radiation-sensitive acid generator. The polymer component includes, in an identical polymer or different polymers, a first structural unit having a first hydrocarbon group, and a second structural unit having a second hydrocarbon group. The first hydrocarbon group is an unsubstituted or substituted branched chain group having no greater than 8 carbon atoms or an unsubstituted or substituted monocyclic alicyclic group having 3 to 8 ring carbon atoms. The second hydrocarbon group has an adamantane skeleton. A molar ratio of the second hydrocarbon group to the first hydrocarbon group is less than 1. A proportion of a structural unit having a hydroxyl group in the polymer component to a total amount of structural units in the polymer component is less than 5 mol %.

According to another aspect of the present invention, a radiation-sensitive resin composition includes a polymer component including a polymer having an acid-labile group, and a radiation-sensitive acid generator. The polymer component includes, in an identical polymer or different polymers, a first structural unit having a first hydrocarbon group, and a second structural unit having a second hydrocarbon group. The first hydrocarbon group is an unsubstituted or substituted branched chain group having no greater than 8 carbon atoms or an unsubstituted or substituted monocyclic alicyclic group having 3 to 8 ring carbon atoms. The second hydrocarbon group has an adamantane skeleton. A molar ratio of the second hydrocarbon group to the first hydrocarbon group is less than 1. A proportion of a structural unit having a hydroxyl group in the polymer component to a total of structural units in the polymer component is less than 5 mol %. The radiation-sensitive resin composition is for use in a resist pattern-forming method carried out using a developer solution containing no less than 80% by mass of an organic solvent.

DESCRIPTION OF THE EMBODIMENTS

According to an embodiment of the present invention made for solving the foregoing problems, a resist pattern-forming method includes:

(1) a resist coating film-forming step in which a radiation-sensitive resin composition is used;

(2) an exposure step; and (3) a development step in which a developer solution containing no less than 80% by mass of an organic solvent is used, the radiation-sensitive resin composition containing:

(A) a polymer component including a polymer having an acid-labile group (hereinafter, may be also referred to as "polymer component (A)"); and (B) a radiation-sensitive acid generator (hereinafter, may be also referred to as "acid generator (B)"), the polymer component (A) including, in an identical polymer or different polymers, (I) a structural unit having (a1) a hydrocarbon group, and (II) a structural unit having (a2) a hydrocarbon group, the hydrocarbon group (a1) being an unsubstituted or substituted branched chain group having no greater than 8 carbon atoms or an unsubstituted or substituted monocyclic alicyclic group having 3 to 8 carbon atoms, the hydrocarbon group (a2) having an adamantane skeleton, a molar ratio of the hydrocarbon group (a2) to the hydrocarbon group (a1) being less than 1, and a proportion of a structural unit having a hydroxyl group in the polymer component (A) to a total amount of structural units in the polymer component being less than 5 mol %.

In the resist pattern-forming method according to the embodiment of the present invention, polarity of the polymer component (A) increases due to an action of the acid generated from the acid generator (B) in the radiation-sensitive resin composition at light-exposed sites, thereby making the polymer component (A) hardly soluble in the developer solution containing an organic solvent at a certain proportion or more, and thus a negative resist pattern is obtained. According to the resist pattern-forming method, as the polymer component (A), the hydrocarbon group (a1) being an unsubstituted or substituted branched chain group having no greater than 8 carbon atoms or an unsubstituted or substituted monocyclic alicyclic group having 3 to 8 carbon atoms, and the hydrocarbon group (a2) having an adamantane skeleton are included, with a molar ratio of the hydrocarbon group (a2) to the hydrocarbon group (a1) being less than 1. In other words, the polymer component (A) in which: the number of the hydrocarbon group (a2) is smaller than that of the hydrocarbon group (a1); and the proportion of the included structural unit having a hydroxyl group is less than the above value is used. Accordingly, both superior etching resistance and inhibition of the film loss after pattern formation of the resulting resist coating film can be achieved, and a resist pattern superior in lithography characteristics such as CDU, MEEF and resolution can be obtained.

Although the reasons for enabling both superior etching resistance and inhibition of the film loss of a resist coating film to be achieved by constituting as described above in the resist pattern-forming method have not been necessarily clear, the following reason may be envisaged. It may be considered, for example, that when the ratio of a comparatively bulky hydrocarbon group (a2) to a comparatively less bulky hydrocarbon group (a1) having an adamantane skeleton contained in the polymer component (A) falls within the above-specified range, a reduction in volume of the resist coating film owing to elimination of the acid-labile group can be suppressed, while maintaining the level of the carbon content that highly correlates to etching resistance. Additionally, it may be also considered in connection with the reason that when the structural unit having a hydroxyl group is included in an amount below the above range, an interaction between the hydroxyl group and a carboxyl group generated at light-exposed sites, and the like, which may be supposed to account for the film loss can be reduced. Moreover, also in regard to the reason for the improvement of lithography characteristics such as CDU, it may be considered, for example, that a contrast between dissolution at the light-exposed site and at the light-unexposed site further increases as a result of adjusting the proportion of the included hydroxyl group to be less than a given value, in addition to the film loss inhibited as described above.

It is preferred that the structural unit (I) is represented by the following formula (1), and the structural unit (II) is represented by the following formula (2):

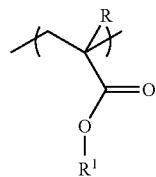

(1)

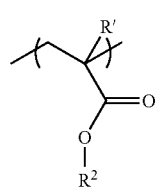

(2)

wherein, in the formulae (1) and (2), R and R' each so independently represent a hydrogen atom, a fluorine atom, a methyl group or a trifluoromethyl group; $R^2$ represents a monovalent hydrocarbon group (a1); and $R^2$ represents a monovalent hydrocarbon group (a2), and $R^1$ and $R^2$ each independently do not have or have a hydroxyl group, a carbonyl group, a cyano group, a nitro group, a sulfonamide group or a combination thereof.

When the structural unit (I) and the structural unit (II) in the polymer component (A) each have the above-specified structure, the polymer component (A) can be conveniently synthesized from the monomers that give the structural unit (I) and the structural unit (II), and molar ratio of the hydrocarbon group (a2) to the hydrocarbon (a1) can be properly adjusted. As a result, improvement of lithography characteristics such as CDU can be readily realized.

$R^1$ in the above formula (1) in the polymer component (A) preferably represents an acid-labile group. When $R^1$ included at a relatively high proportion in the polymer component (A) represents an acid-labile group, pattern formation properties can be improved. In addition, since $R^1$ eliminated is comparatively small, it is transpired by post exposure baking (PEB) and the like following the exposure step, and is less likely to remain in the resist coating film; therefore, lithography characteristics such as CDU of the resultant resist pattern can be further improved.

$R^2$ in the above formula (2) in the polymer component (A) preferably represents a group each represented by the following formulae (2-1) to (2-4), an acid-labile group or a combination thereof.

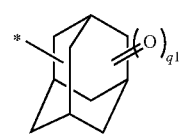

(2-1)

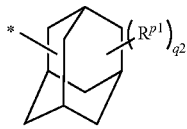

(2-2)

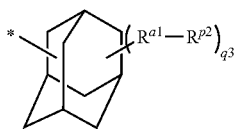
(2-3)

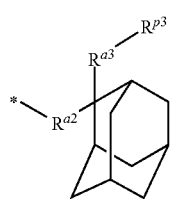
(2-4)

wherein, in the formulae (2-1) to (2-4), $R^{p1}$, $R^{p2}$ and $R^{p3}$ each independently represent a hydroxyl group, a cyano group, a nitro group or a sulfonamide group; $R^{a1}$ and $R^{a2}$ each independently represent a methylene group or an alkylene group having 2 to 10 carbon atoms; $R^{a3}$ represents a single bond, a methylene group or an alkylene group having 2 to 10 carbon atoms; q1 is an integer of 1 to 6; and q2 and q3 are each independently an integer of 1 to 15, wherein in a case where $R^{p1}$, $R^{p2}$ and $R^{a1}$ are each present in a plurality of number, a plurality of $R^{p1}$s are each identical or different, a plurality of $R^{p2}$s are each identical or different and a plurality of $R^{a1}$s are each identical or different, and wherein * denotes a binding site to an ester group in the above formula (2).

The above formulae (2-1) to (2-4) represent an adamantane skeleton-containing acid-nonlabile group having a carbonyl group, a hydroxyl group, a cyano group or a sulfonamide group. When $R^2$ represents the group having the above-specified structure, a film loss that may be caused by dissolution of the surface in a developer solution containing an organic solvent at light-exposed sites that are highly hydrophobic can be further inhibited. Also in the case in which $R^2$ represents an acid-labile group, eliminated $R^2$ is less likely to be transpired during PEB and the like, and thus remains in the resist coating film, whereby the effects similar to those described above can be exhibited.

The molar ratio of the hydrocarbon group (a2) to the hydrocarbon group (a1) is preferably no less than 0.1 and no greater than 0.9. When the molar ratio of the hydrocarbon group (a2) to the hydrocarbon group (a1) is adjusted to fall within the above-specified range, both etching resistance and inhibition of the film loss of the resist coating film can be achieved at a higher level.

The hydrocarbon group (a2) preferably has a hydroxyl group, a carbonyl group or a combination thereof. When the hydrocarbon group (a2) has the above-specified group, MEEF characteristics of the resultant resist pattern can be improved.

It is preferred that the polymer component (A) further includes a structural unit having a lactone group, a cyclic carbonate group or a combination thereof. When the polymer component (A) further includes the structural unit having the above-specified group, basic characteristics as a resist such as adhesiveness of the resultant resist coating film to a substrate can be further improved.

The proportion of the acid-labile group in the hydrocarbon group (a1) and the hydrocarbon group (a2) is preferably no less than 50 mol %. When the proportion of the acid-labile group in the hydrocarbon group (a1) and the hydrocarbon group (a2) is no less than 50 mol %, pattern formation properties are improved, and as a result, lithography characteristics such as CDU can be further improved.

The radiation-sensitive acid generator (B) is preferably represented by the following formula (B-1), and it is more preferred that Rr in the following formula (B-1) is represented by the following formula (i):

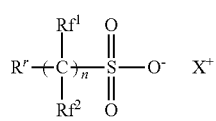
(B-1)

wherein, in the formula (B-1), $Rf^1$ and $Rf^2$ each independently represent a hydrogen atom, a fluorine atom, or a fluorinated alkyl group having 1 to 4 carbon atoms; n is an integer of 1 to 3, wherein any case in which $Rf^1$ and $Rf^2$ bonded to carbon at an α-position of the sulfonate group both represent a hydrogen atom is excluded, and in a case where $Rf^1$ and $Rf^2$ are each present in a plurality of number, a plurality of $Rf^1$s are each identical or different and a plurality of $Rf^2$s are each identical or different; $R^r$ represents a monovalent organic group having 3 to 20 carbon atoms and having an alicyclic structure; and $X^+$ represents a monovalent cation:

(i)

wherein, in the formula (i), A represents a linking group having a valency of (m+1); m is an integer of 1 to 3; and $R^{r1}$ represents a monovalent organic group having 3 to 20 carbon atoms and having an alicyclic structure.

Due to having an alicyclic structure similarly to the polymer component (A), the radiation-sensitive acid generator (B) has increased miscibility and improved dispersibility, and further diffusion in the resist coating film is appropriately controlled. As a result, lithography characteristics such as CDU of the resultant resist pattern can be further improved.

The radiation-sensitive resin composition of the embodiment of the present invention is for use in a resist pattern-forming method carried out using a developer solution containing no less than 80% by mass of an organic solvent, and the radiation-sensitive resin composition contains:

(A) a polymer component including a polymer having an acid-labile group; and (B) a radiation-sensitive acid generator, the polymer component (A) including, in an identical polymer or different polymers, (I) a structural unit having (a1) a hydrocarbon group, and (II) a structural unit having (a2) a hydrocarbon group, the hydrocarbon group (a1) being a unsubstituted or substituted branched chain group having no greater than 8 carbon atoms or an unsubstituted or substituted monocyclic alicyclic group having 3 to 8 ring carbon atoms, the hydrocarbon group (a2) having an adamantane skeleton, a molar ratio of the hydrocarbon group (a2) to the hydrocarbon group (a1) being less than 1, and a proportion of a structural unit having a hydroxyl group in the polymer component (A) to a total amount of structural units in the polymer component being less than 5 mol %.

When the radiation-sensitive resin composition is used in a resist pattern-forming method carried out using a developer solution containing no less than 80% by mass of an organic solvent, a resist pattern capable of achieving both superior etching resistance and inhibition of the film loss of a resist coating film, and being superior in lithography characteristics such as CDU can be obtained.

As referred to herein, a term "branched chain group" means a chain group having a branched structure, and does not have a cyclic structure such as an aliphatic ring or an aromatic ring. Also, a term "monocyclic alicyclic group" as referred to herein means a group derived from a monocyclic aliphatic cyclic hydrocarbon by removing one or more hydrogen atom(s) bonded to a carbon atom constituting the carbon ring.

According to the resist pattern-forming method of the embodiment of the present invention, and a radiation-sensitive resin composition suited for the method, both superior etching resistance and inhibition of the film loss of a resist coating film can be achieved while formation of a fine pattern is enabled by development using an organic solvent, and a resist pattern superior in lithography characteristics such as CDU, MEEF and resolution can be formed. The embodiments will now be described in detail.

Resist Pattern-Forming Method

An embodiment of the present invention provides a resist pattern-forming method including: (1) resist coating film-forming step of coating a radiation-sensitive resin composition on a substrate (hereinafter, may be also referred to as "step (1)"); (2) an exposure step (hereinafter, may be also referred to as "step (2)"); and (3) a development step in which a developer solution containing no less than 80% by mass of an organic solvent is used (hereinafter, may be also referred to as "step (3)"), the radiation-sensitive resin composition containing (A) a polymer component and (B) a radiation-sensitive acid generator. Hereinafter, each step will be described in detail.

Step (1)

In this step, the composition used in the embodiment of the present invention is coated on a substrate to provide a resist coating film. As the substrate, for example, conventionally well-known substrates such as a silicon wafer and a wafer coated with aluminum can be used. In addition, organic or inorganic antireflective films disclosed in, for example, Japanese Examined Patent Application, Publication No. H06-12452, Japanese Unexamined Patent Application, Publication No. S59-93448, and the like may be provided on the substrate.

A coating method is exemplified by spin-coating, cast coating, roll coating, and the like. It is to be noted that the film thickness of the resist coating film provided is typically 0.01 μm to 1 μm, and preferably 0.01 μm to 0.5 μm.

After coating the radiation-sensitive resin composition, a solvent in the coating film may be volatilized as needed by prebaking (PB). According to heating conditions of PB, the temperature may be appropriately selected depending on the formulation of the radiation-sensitive resin composition, and is typically about 30° C. to 200° C. and preferably 50° C. to 150° C.

A protective film as disclosed in Japanese Patent Application Publication No. H05-188598 or the like may be provided on the resist layer so that the resist film is not affected by basic impurities and the like contained in the environmental atmosphere. Furthermore, in order to prevent outflow of the acid generating agent and the like from the resist layer, a liquid immersion lithography protective film as disclosed in Japanese Patent Application Publication No. 2005-352384 or the like may be provided on the resist layer. These techniques may be used in combination.

Step (2)

In this step, the resist coating film provided in the step (1) is exposed at a desired region by carrying out reduction projection through a mask having a specific pattern, and as needed an immersion liquid. For example, an isolated trench (iso-trench) pattern can be formed by carrying out reduced projection exposure at a desired region through a mask of an isolated line (iso-line) pattern. Also, the exposure may be carried out at least twice depending on the desired pattern and the mask pattern. When the exposure is carried out at least twice, the exposure is preferably carried out continuously. When the exposure is carried out a plurality of times, for example, first reduced projection exposure is carried out through a line-and-space pattern mask at a desired region, and subsequently second reduced projection exposure is carried out such that lines cross over light-exposed sites subjected to the first exposure. The first light-exposed sites are preferably orthogonal to the second light-exposed sites. Due to being orthogonal with each other, a perfect circular contact hole pattern can be easily formed at light-unexposed sites surrounded by light-exposed sites. It is to be noted that examples of the immersion liquid for use in the exposure include water, a fluorine-containing inert liquid, and the like. It is preferred that the immersion liquid be transparent to the exposure wavelength, and has a temperature coefficient of the refractive index as small as possible so that distortion of an optical image projected onto the film is minimized. When an ArF excimer laser (wavelength: 193 nm) is used as the exposure light source, it is preferred to use water from the viewpoint of availability and ease of handling, in addition to the viewpoints described above. In the case in which water is used, an additive that decreases the surface tension of water and increases surface active force may be added in a slight amount. It is preferred that the additive does not dissolve the resist layer on a wafer, and has a negligible influence on an optical coating of an inferior face of a lens. Water employed is preferably distilled water.

A radioactive ray used for the exposure is appropriately selected in accordance with the type of the acid generator (B), and is exemplified by an ultraviolet ray, a far ultraviolet ray, an X-ray, a charged particle ray, and the like. Among these, a far ultraviolet ray typified by an ArF excimer laser or a KrF excimer laser (wavelength: 248 nm) is preferred, and an ArF excimer laser is more preferred. The exposure conditions such as an exposure dose are appropriately selected in accordance with the formulation, and type of additives etc. of the radiation-sensitive resin composition. The resist pattern-forming method of the embodiment of the present invention may include a plurality of the exposure steps, and light sources employed in the exposure carried out a plurality of times may be identical or different, but an ArF excimer laser beam is preferably used in the first exposure step.

In addition, it is preferred that post-exposure baking (PEB) is carried out after the exposure. When the PEB is carried out, a dissociate reaction of an acid-labile group in the radiation-sensitive resin composition can smoothly proceed. According to heating conditions of PEB, the temperature may be typically 30° C. to 200° C., and preferably 50° C. to 170° C.

Step (3)

In this step, after the exposure in the step (2), development is carried out using a negative developer solution containing no less than 80% by mass of an organic solvent to form a pattern. The negative developer solution as referred to means a developer solution that selectively dissolve and remove poorly light-exposed sites and light-unexposed sites. The organic solvent contained in the negative developer solution is preferably at least one selected from the group consisting of an alcohol solvent, an ether solvent, a ketone organic solvent, an amide solvent, an ester organic solvent and a hydrocarbon solvent.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ether solvent include diethyl ether, dipropyl ether, dibutyl ether, diphenyl ether, methoxybenzene, and the like.

Examples of the ketone solvent include acetone, methyl ethyl ketone, methyl n-propyl ketone, methyl n-butyl ketone, diethyl ketone, methyl iso-butyl ketone, methyl n-pentyl ketone, ethyl n-butyl ketone, methyl n-hexyl ketone, di-iso-butyl ketone, trimethylnonanone, cyclopentanone, cyclohexanone, cycloheptanone, cyclooctanone, methylcyclohexanone, 2,4-pentanedione, acetonyl acetone, acetophenone, and the like.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include diethyl carbonate, propylene carbonate, methyl acetate, ethyl acetate, γ-butyrolactone, γ-valerolactone, n-propyl acetate, iso-propyl acetate, n-butyl acetate, iso-butyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, glycol diacetate, methoxytriglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the hydrocarbon solvent include:

aliphatic hydrocarbon solvents such as n-pentane, iso-pentane, n-hexane, iso-hexane, n-heptane, iso-heptane, 2,2,4-trimethyl pentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, i-propylbenzene, diethylbenzene, i-butylbenzene, triethylbenzene, di-i-propylbenzene and n-amylnaphthalene, and the like.

Of these, n-butyl acetate, isopropyl acetate, n-amyl acetate, methyl ethyl ketone, methyl-n-butyl ketone, and methyl-n-amyl ketone are preferred. These organic solvents may be used either alone, or in combination of two or more thereof.

The content of the organic solvent in the developer solution is no less than 80% by mass. When the content of the organic solvent in the developer solution is no less than 80% by mass, a contrast of the pattern resulting from the exposure, i.e., depending on being exposed or unexposed, can be improved, and consequently, a resist pattern that is superior in development characteristics and lithography characteristics can be formed. It is to be noted that examples of components other than the organic solvent include water, a silicon oil, and the like.

A surfactant may be added to the developer solution in an appropriate amount as needed. As the surfactant, for example, an ionic or nonionic fluorochemical surfactant and/or a silicon surfactant, and the like may be used.

Examples of the development method include a dipping method that immerses the substrate in a container filled with the developer for a given time, a puddle method that allows the developer to be present on the surface of the substrate due to surface tension for a given time, a spraying method that sprays the developer onto the surface of the substrate, a dynamic dispensing method that applies the developer to the substrate that is rotated at a constant speed while scanning with a developer application nozzle at a constant speed, and the like.

In the resist pattern-formation, it is preferred that a step of rinsing the resist coating film with a rinse agent be carried out after the development in the step (3). Moreover, also as the rinse agent in the rinsing step, an organic solvent may be used, whereby scum generated can be efficiently washed away. The rinse agent is preferably a hydrocarbon solvent, a ketone solvent, an ester solvent, an alcohol solvent, an amide solvent, or the like. Of these, an alcohol solvent and an ester solvent are preferred, and a monovalent alcohol solvent having 6 to 8 carbon atoms is more preferred. The monovalent alcohol having 6 to 8 carbon atoms is exemplified linear, branched or cyclic monovalent alcohols, and examples thereof include 1-hexanol, 1-heptanol, 1-octanol, 4-methyl-2-pentanol, 2-hexanol, 2-heptanol, 2-octanol, 3-hexanol, 3-heptanol, 3-octanol, 4-octanol, benzyl alcohol, and the like. Of these, 1-hexanol, 2-hexanol, 2-heptanol, and 4-methyl-2-pentanol are preferred.

Each component of the rinse agent may be used either alone, or in combination of two or more thereof. The moisture content in the rinse agent is preferably no greater than 10% by mass, even more preferably no greater than 5% by mass, and particularly preferably no greater than 3% by mass. When the moisture content is no greater than 10% by mass, favorable development characteristics can be attained. It is to be noted that a surfactant may be added to a rinse agent described later.

Examples of the rinsing method include a spinning method that applies the rinse agent to the substrate that is rotated at a constant speed, a dipping method that immerses the substrate in a container filled with the rinse agent for a given time, a spraying method that sprays the rinse agent onto the surface of the substrate, and the like.

Radiation-Sensitive Resin Composition

The radiation-sensitive resin composition for use in the resist pattern-forming method according to the embodiment of the present invention contains (A) a polymer component and (B) an acid generator. Furthermore, optional components may be contained within a range not leading to impairment of the effects of the embodiment of the present invention. Hereinafter, each component will be described in detail.

Polymer Component (A)

The polymer component (A) includes a polymer having an acid-labile group. The polymer component (A) may include constituting one type of polymer, or a plurality of types of polymers. The mode of including the acid-labile group in the polymer component (A) is not particularly limited, and the polymer component (A) may include only the polymer having an acid-labile group, or may include the polymer having an acid-labile group and a polymer not having an acid-labile group. The acid-labile group means a group that substitutes for a hydrogen atom in a carboxyl group, a hydroxyl group and the like, and is dissociated by an action of an acid generated from the acid generator (B) upon exposure.

The polymer component (A) includes, in an identical polymer or different polymers, (I) a structural unit having (a1) a hydrocarbon group, and (II) a structural unit having (a2) a hydrocarbon group, the hydrocarbon group (a1) being a unsubstituted or substituted branched chain group having no greater than 8 carbon atoms or an unsubstituted or substituted monocyclic alicyclic group having 3 to 8 ring carbon atoms, the hydrocarbon group (a2) having an adamantane skeleton, a molar ratio of the hydrocarbon group (a2) to the hydrocarbon group (a1) being less than 1, and a proportion of the structural unit having a hydroxyl group being less than 5 mol %.

The radiation-sensitive resin composition, due to the polymer component (A) having the above specified structure, enables both superior etching resistance and a film loss of the resist coating film to be achieved. In addition, a combination of the radiation-sensitive resin composition containing the polymer component (A) with the characteristic resist pattern-forming method can form a resist pattern that is superior in lithography characteristics such as CDU.

The mode of including the structural unit (I) and the structural unit (II) in the polymer component (A) is not particularly limited, and the polymer component (A) may include a polymer having both the structural unit (I) and the structural unit (II), or may include a polymer having the structural unit (I) and a polymer having the structural unit (II).

Structural Unit (I)

The structural unit (I) has the hydrocarbon group (a1) that is an unsubstituted or substituted branched chain group having no greater than 8 carbon atoms or an unsubstituted or substituted monocyclic alicyclic group having 3 to 8 ring carbon atoms. The valency of the hydrocarbon group (a1) is not particularly limited. The hydrocarbon group (a1) may be either a monovalent group such as an alkyl group, an alkenyl group, an alkynyl group, a monocyclic cycloalkyl group or a group derived therefrom by substituting a part or all of hydrogen atoms, or a divalent or polyvalent group such as an alkanediyl group, an alkanetriyl group, a cycloalkanediyl group, a cycloalkanetriyl group or a group derived therefrom by substituting a part or all of hydrogen atoms, as long as the hydrocarbon group (a1) is an unsubstituted or substituted branched chain group having no greater than 8 carbon atoms or an unsubstituted or substituted monocyclic alicyclic group having 3 to 8 ring carbon atoms. In light of improvement of lithography characteristics such as CDU, as a result of appropriately reduced rigidity of the polymer of the polymer component (A), a monovalent group is preferred. The number of the hydrocarbon group (a1) in the structural unit (I) is not particularly limited, which may be either one, or greater, and preferably one. The structural unit (I) may have one, or two or more types of the hydrocarbon group (a1). The substituent is not particularly limited, and examples thereof include polar groups such as a hydroxyl group, a carbonyl group, a cyano group, a nitro group and a sulfonamide group, alkyl groups, alkyl groups having the polar group, and the like.

The structural unit (I) is preferably the structural unit represented by the above formula (1).

In the above formula (1), R represents a hydrogen atom, a fluorine atom, a methyl group or a trifluoromethyl group; $R^1$ represents a monovalent hydrocarbon group (a1), wherein $R^1$ may have a hydroxyl group, a carbonyl group, a cyano group, a nitro group, a sulfonamide group or a combination thereof (i.e., a polar group).

The structural unit (I) represented by the above formula (1) has a monovalent hydrocarbon group (a1), whereby rigidity of the polymer of the polymer component (A) is appropriately reduced, and as a result, lithography characteristics such as CDU of the resultant resist pattern can be improved. In addition, a monomer that gives such a structural unit (I) can be conveniently synthesized, and synthesis of the polymer component (A) is enabled using the monomer by highly adjusting the proportion of the structural unit (I) included.

The hydrocarbon group (a1) may or may not have a polar group.

Examples of the monovalent hydrocarbon group (a1) that is represented by $R^1$ and does not have a polar group include:

branched chain groups having no greater than 8 carbon such as a methyl group, an ethyl group, a n-propyl group, an i-propyl group, a n-butyl group, an i-butyl group, a sec-butyl group, a t-butyl group, a n-pentyl group, an i-pentyl group, a sec-pentyl group, a t-pentyl group, a neo-pentyl group, a n-hexyl group, an i-hexyl group, a sec-hexyl group, a t-hexyl group, a neo-hexyl group, a n-heptyl group, an i-heptyl group, a sec-heptyl group, a t-heptyl group, a neo-heptyl group, a n-octyl group, an i-octyl group, a sec-octyl group, a t-octyl group and a neo-octyl group;

monocyclic alicyclic groups having 3 to 8 ring carbon atoms such as a cyclopropyl group, a 1-methylcyclopropyl group, a cyclobutyl group, a 1-methylcyclobutyl group, a 1-ethylcyclobutyl group, a cyclopentyl group, a 1-methylcyclopentyl group, a 1-ethylcyclopentyl group, a 1-n-propylcyclopentyl group, a 1-1-propylcyclopentyl group, a cyclohexyl group, a 1-methylcyclohexyl group, a 1-ethylcyclohexyl group, a 1-n-propylcyclohexyl group, a 1-1-propylcyclohexyl group, a cycloheptyl group, a 1-methylcycloheptyl group, a 1-ethylcycloheptyl group, a 1-n-propylcycloheptyl group, a 1-1-propylcycloheptyl group, a cyclooctyl group, a 1-methylcyclooctyl group, a 1-ethylcyclooctyl group, a 1-n-propylcyclooctyl group and a 1-1-propylcyclooctyl group, and the like.

Examples of the hydrocarbon group (a1) that is represented by $R^1$ and has a polar group include groups derived by substituting a part or all of hydrogen atoms of the aforementioned hydrocarbon group (a1) that does not have the polar group for the polar group described above.

The monovalent hydrocarbon group (a1) represented by $R^1$ may or may not be an acid-labile group, and is preferably an acid-labile group. When $R^1$ included at a relatively high proportion in the polymer component (A) represents an acid-labile group, pattern formation properties can be improved. In addition, since $R^1$ eliminated is comparatively small, it is transpired by PEB and the like. As a result, lithography characteristics such as CDU of the resultant resist pattern can be improved.

Examples of the monovalent hydrocarbon group (a1) represented by $R^1$ that is an acid-labile group include a t-butyl group, a t-pentyl group, a t-hexyl group, a t-heptyl group, a t-octyl group, a 1-methylcyclopropyl group, a 1-methylcyclobutyl group, a 1-ethylcyclobutyl group, a 1-methylcyclopentyl group, a 1-ethylcyclopentyl group, a 1-n-propylcyclopentyl group, a 1-1-propylcyclopentyl group, a 1-methylcyclohexyl group, a 1-ethylcyclohexyl group, a 1-n-propylcyclohexyl group, a 1-1-propylcyclohexyl group, a 1-methylcycloheptyl group, a 1-ethylcycloheptyl group, a 1-n-propylcycloheptyl group, a 1-1-propylcycloheptyl group, a 1-methylcyclooctyl group, a 1-ethylcyclooctyl group, a 1-n-propylcyclooctyl group, a 1-1-propylcyclooctyl group, and the like.

Examples of the structural unit (I) having a hydrocarbon group (a1) that does not have a polar group include structural units represented by the following formulae.

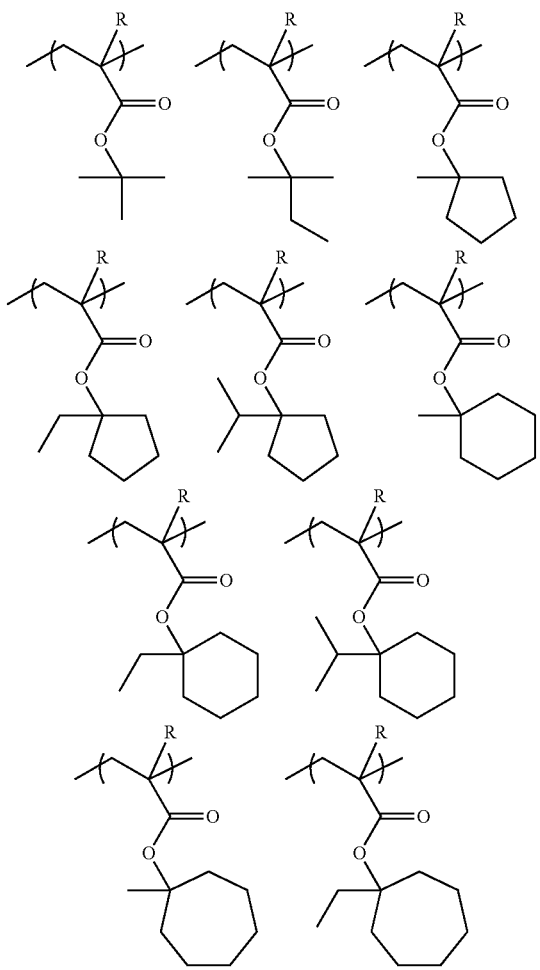

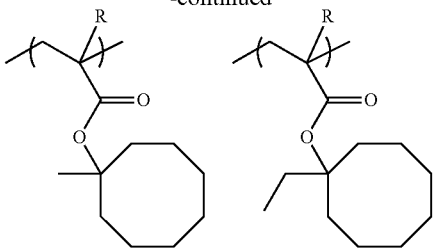

In the above formulae, R is as defined in the above formula (1).

Examples of the structural unit (I) having a hydrocarbon group (a1) that has a polar group include structural units represented by the following formulae.

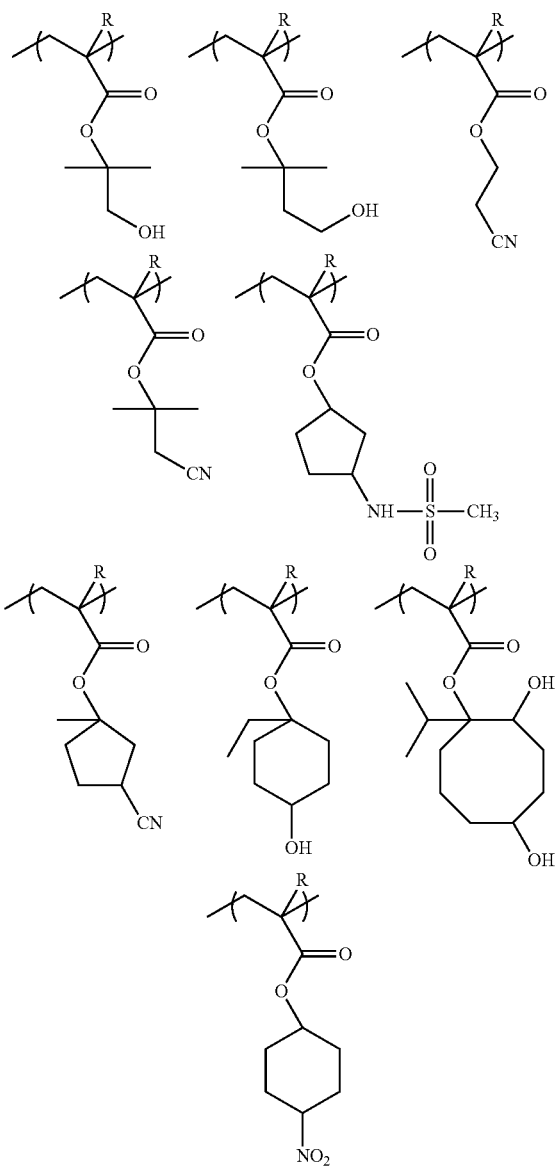

In the above formulae, R is as defined in the above formula (1).

Structural Unit (II)

The structural unit (II) has the hydrocarbon group (a2) having an adamantane skeleton. Due to having a bulky adamantane skeleton, the hydrocarbon group (a2) can enhance etching resistance of the resulting resist coating film. The valency of the hydrocarbon group (a2) is not particularly limited. The hydrocarbon group (a2) may be either a monovalent group such as an adamantyl group, or a divalent or polyvalent group such as an adamantanediyl group or an adamantanetriyl group as long as it has an adamantane skeleton. In light of improvement of lithography characteristics such as CDU, as a result of appropriately reduced rigidity of the polymer of the polymer component (A), a monovalent group is preferred. The number of the hydrocarbon group (a2) in the structural unit (II) is not particularly limited, which may be either one, o4r greater, and preferably one. The structural unit (II) may have one, or two or more types of the hydrocarbon group (a2). Furthermore, a part or all of hydrogen atoms of the hydrocarbon group (a2) may be substituted by the aforementioned polar group, alkyl group, alicyclic hydrocarbon group, a combined group thereof or the like.

The structural unit (II) is preferably the structural unit represented by the above formula (2).

In the above formula (2), R represents a hydrogen atom, a fluorine atom, a methyl group or a trifluoromethyl group; $R^2$ represents a monovalent hydrocarbon group (a2), wherein $R^2$ may have a hydroxyl group, a carbonyl group, a cyano group, a nitro group, a sulfonamide group or a combination thereof (i.e., a polar group).

The structural unit (II) represented by the above formula (2) has a monovalent hydrocarbon group (a2), whereby rigidity of the polymer of the polymer component (A) is appropriately reduced, and as a result, lithography characteristics such as CDU of the resultant resist pattern can be improved. In addition, a monomer that gives such a structural unit (II) can be conveniently synthesized, and synthesis of the polymer component (A) is enabled using the monomer by highly adjusting the proportion of the structural unit (II) included.

The hydrocarbon group (a2) may or may not have the polar group.

Examples of the monovalent hydrocarbon group (a2) that is represented by $R^2$ and does not have a polar group include:
a 1-adamantyl group, a 2-adamantyl group, a 2-methyl-2-adamantyl group, a 2-ethyl-2-adamantyl group, a 2-n-propyl-2-adamantyl group, a 2-1-propyl-2-adamantyl group, a 1-adamantyl-2-propyl group, a 2-adamantyl-2-propyl group, and the like.

Examples of the hydrocarbon group (a2) having a polar group include groups derived from the monovalent hydrocarbon group (a2) represented by $R^2$ by substituting a part or all of hydrogen atoms by a polar group.

The monovalent hydrocarbon group (a2) represented by $R^2$ may or may not be an acid-labile group.

Examples of the monovalent hydrocarbon group (a2) represented by $R^2$ that is an acid-labile group include a 2-methyl-2-adamantyl group, a 2-ethyl-2-adamantyl group, a 2-n-propyl-2-adamantyl group, a 2-1-propyl-2-adamantyl group, a 1-adamantyl-2-propyl group, a 2-adamantyl-2-propyl group, and the like.

The hydrocarbon group (a2) preferably used has the polar group described above. When the hydrocarbon group (a2) has the polar group, a film loss which is believed to mainly result from an adamantane skeleton can be effectively inhibited. Examples of the polar group include a hydroxyl group, a carbonyl group, a cyano group, a nitro group, a sulfonamide group or a combination thereof, and of these, in light of improvement of MEEF characteristics, a hydroxyl group, a carbonyl group or a combination thereof is more preferred.

The hydrocarbon group (a2) having a polar group is preferably any one of groups each represented by the above formula (2-1) to (2-4), or a combination thereof.

In the above formulae (2-1) to (2-4), $R^{p1}$, $R^{p2}$ and $R^{p3}$ each independently represent a hydroxyl group, a cyano group, a nitro group or a sulfonamide group; $R^{a1}$ and $R^{a2}$ each independently represent a methylene group or an alkylene group having 2 to 10 carbon atoms; $R^{a1}$ represents a single bond or a methylene group; q1 is an integer of 1 to 6; and q2 and q3 are each independently an integer of 1 to 15, wherein in a case where $R^{p1}$, $R^{p2}$ and $R^{a1}$ are each present in a plurality of number, a plurality of $R^{p1}$s are each identical or different, a plurality of $R^{p2}$s are each identical or different and a plurality of $R^{a1}$s are each identical or different, and wherein * denotes a binding site to an ester group in the above formula (2).

Examples of the alkylene group having 2 to 10 carbon atoms represented by $R^{a1}$ and $R^{a2}$ include an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,7-heptylene group, a 1,8-octylene group, a 1,9-nonylene group, a 1,10-decylene group, and the like.

Specific examples of the group represented by the above formula (2-1) include groups represented by the following formulae.

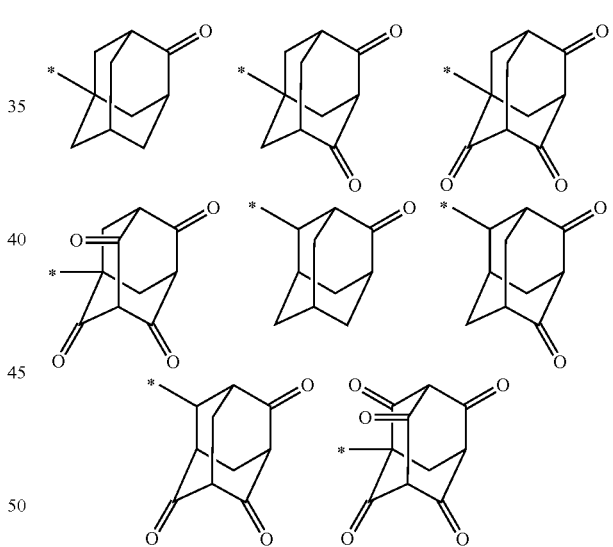

In the above formulae, * denotes a binding site to an ester group in the above formula (2).

Specific examples of the group represented by the above formula (2-2) include groups represented by the following formulae.

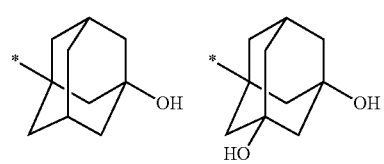

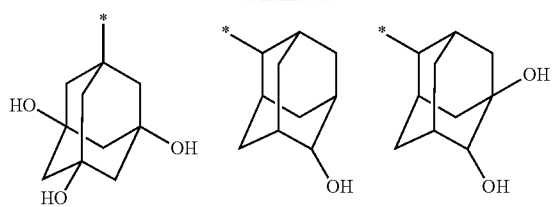
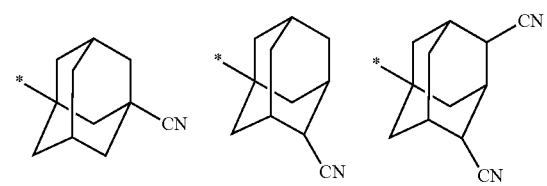
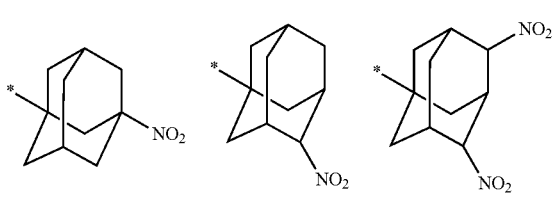
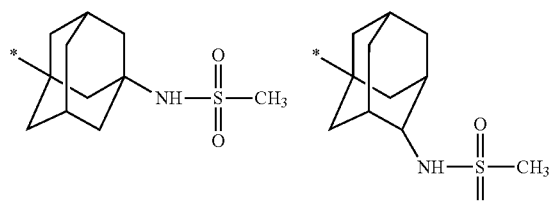
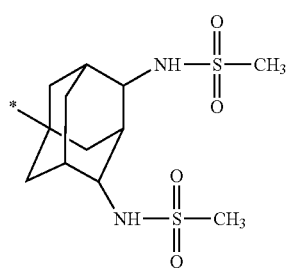

In the above formulae, * denotes a binding site to an ester group in the above formula (2).

Specific examples of the group represented by the above formula (2-3) include groups represented by the following formulae.

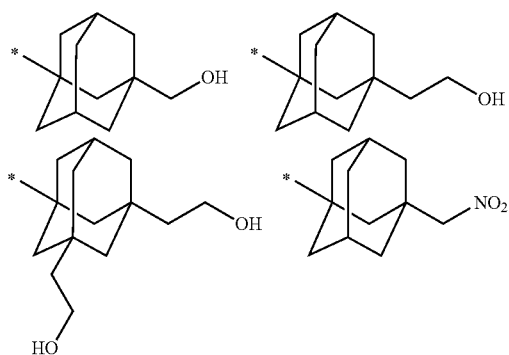

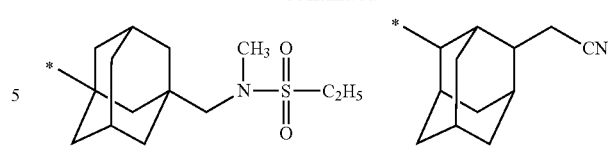

In the above formulae, * denotes a binding site to an ester group in the above formula (2).

Specific examples of the group represented by the above formula (2-4) include groups represented by the following formulae.

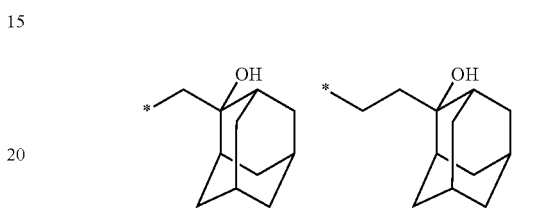
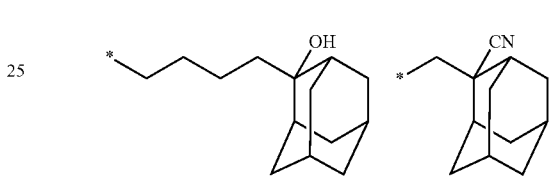
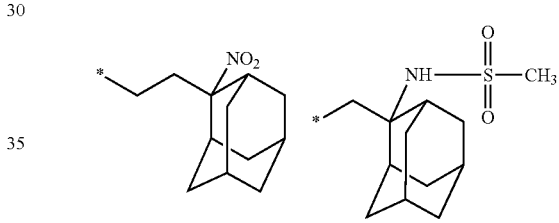
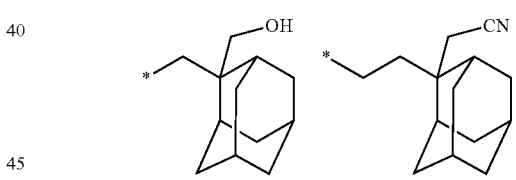
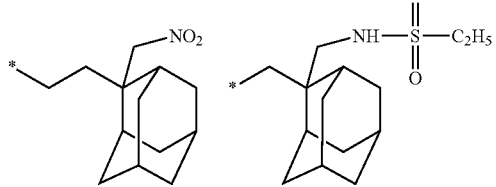
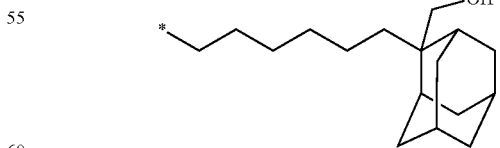

In the above formulae, * denotes a binding site to an ester group in the above formula (2).

Examples of the structural unit (II) having a hydrocarbon group (a2) that does not have a polar group include structural units represented by the following formulae.

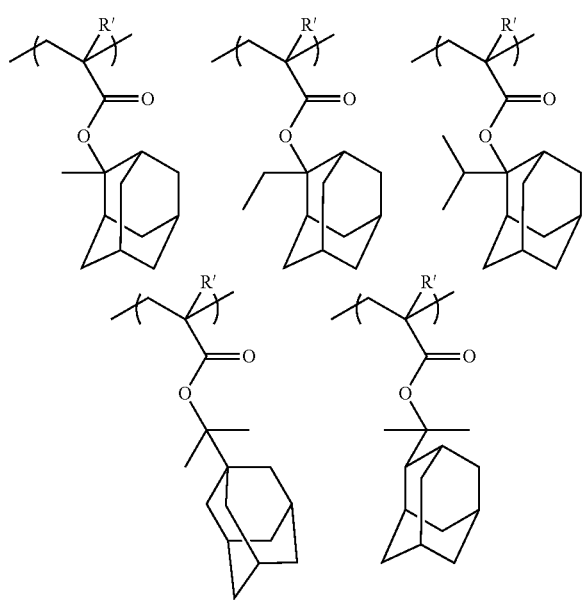

In the above formulae, R' is as defined in the above formula (2).

In addition, examples of the structural unit (II) having a hydrocarbon group (a2) that has a polar group include structural units represented by the following formulae.

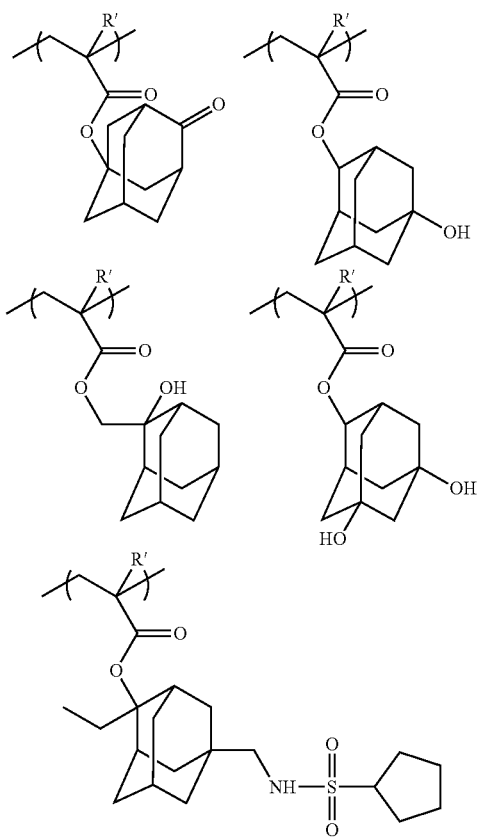

In the above formulae, R' is as defined in the above formula (2).

Relationship Between Hydrocarbon Group (a1) and Hydrocarbon Group (a2)

In the polymer component (A), the molar ratio of the hydrocarbon group (a2) to the hydrocarbon group (a1) should be necessarily less than 1. When the molar ratio of the hydrocarbon group (a2) to the hydrocarbon group (a1) is less than 1, it is believed that suppression of dissolution of the polymer component (A) at light-exposed sites can be balanced with a high content of carbon of the polymer component (A), and consequently, both superior etching resistance and inhibition of the film loss after pattern formation of the resulting resist coating film can be achieved. Additionally, a resist pattern that is superior in lithography characteristics such as CDU can be obtained.

The molar ratio of the hydrocarbon group (a2) to the hydrocarbon group (a1) is preferably no less than 0.1 and no greater than 0.9, more preferably no less than 0.15 and no greater than 0.85, still more preferably no less than 0.2 and no greater than 0.8, and particularly preferably no less than 0.3 and no greater than 0.7. When the molar ratio is adjusted to fall within the above range, inhibition of the film loss of the resist coating film and etching resistance can be both achieved at a higher level.

The proportion of the acid-labile group in the hydrocarbon group (a1) and the hydrocarbon group (a2) is preferably no less than 50 mol %. When the proportion of the acid-labile group in the hydrocarbon group (a1) and the hydrocarbon group (a2) is no less than 50 mol %, lithography characteristics such as CDU can be further improved. When the proportion of the acid-labile group is less than 50 mol %, pattern formation properties tend to be deteriorated. The proportion of the acid-labile group is more preferably no less than 60 mol %, and still more preferably no less than 70 mol %.

The proportion of the structural unit (I) included in the polymer component (A) with respect to the entire structural units constituting polymer component (A) is preferably 20 mol % to 80 mol %, more preferably 25 mol % to 70 mol %, and still more preferably 30 mol % to 60 mol %. When the proportion of the structural unit (I) included is less than 20 mol %, pattern formation properties may be deteriorated. On the other hand, when the proportion of the structural unit (I) included exceeds 80 mol %, the etching resistance tends to be impaired. It is to be noted that the polymer component (A) may include one, or two or more types of the structural unit (I).

The proportion of the structural unit (II) included in polymer component (A) with respect to the entire structural units constituting the polymer component (A) is preferably 5 mol % to 40 mol %, more preferably 5 mol % to 35 mol %, and still more preferably 10 mol % to 30 mol %. When the proportion of the structural unit (II) included is less than 5 mol %, etching resistance tends to be impaired. On the other hand, when the proportion of the structural unit (II) included exceeds 40 mol %, resolution tends to be impaired. It is to be noted that the polymer component (A) may include one, or two or more types of the structural unit (II).

Structural Unit (III)

It is preferred that the polymer component (A) further includes a structural unit having a lactone group, a cyclic carbonate group or a combination thereof (hereinafter, may be also referred to as "structural unit (III)"). When the polymer component (A) further includes a structural unit having a lactone group and/or a cyclic carbonate group, basic characteristics as a resist such as adhesiveness of the resist coating film to a substrate can be more improved. In addition, solubility of the resist coating film in a developer solution can be improved. The "lactone group" as herein referred to indicates a cyclic group having one ring that includes a bond represented by —O—C(O)— (i.e., lactone ring). Further, the "cyclic carbonate group" indicates a cyclic group having one ring that includes a bond represented by —O—C(O)—O— (i.e., cyclic carbonate ring). The lactone ring or the cyclic carbonate ring is counted as a first ring, and when only the lactone ring or the cyclic carbonate ring is included, the group is referred to as a "monocyclic group", whereas when other ring structure is further included, the group is referred to as a "polycyclic group", irrespective of its structure.

Examples of the structural unit having a lactone group include structural units represented by the following formulae.

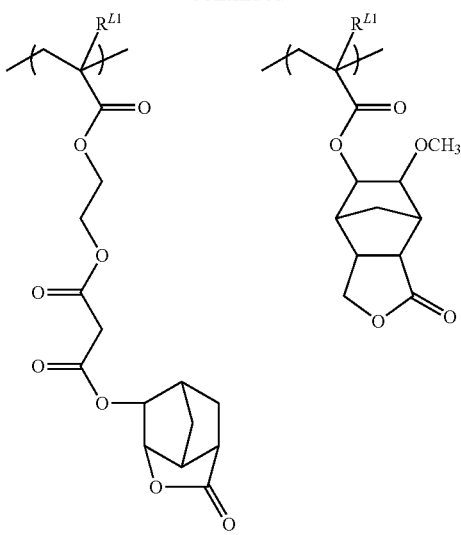

-continued

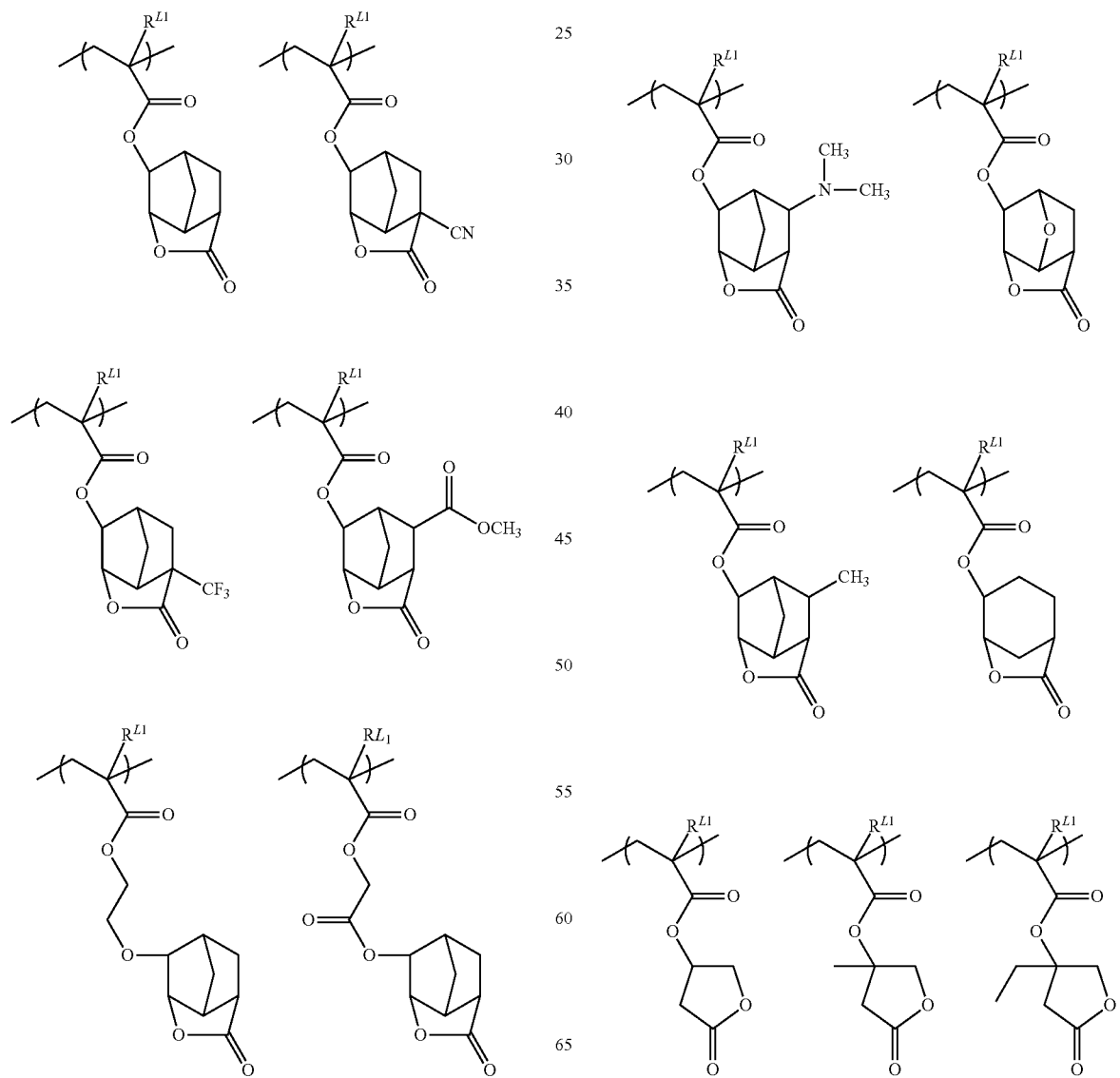

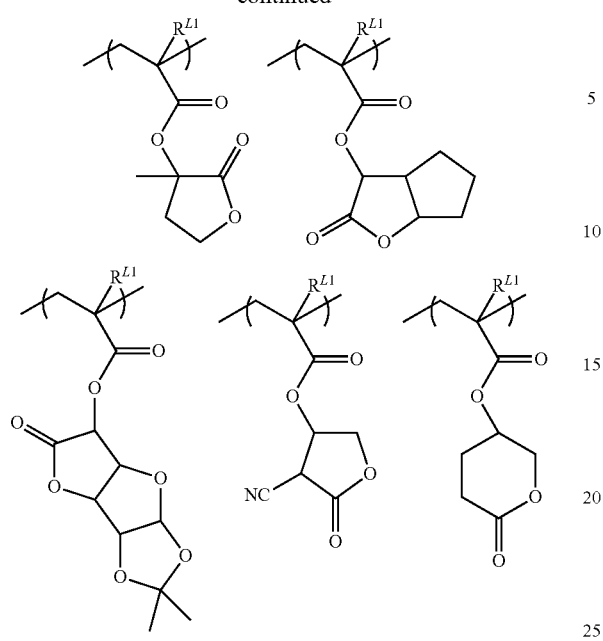
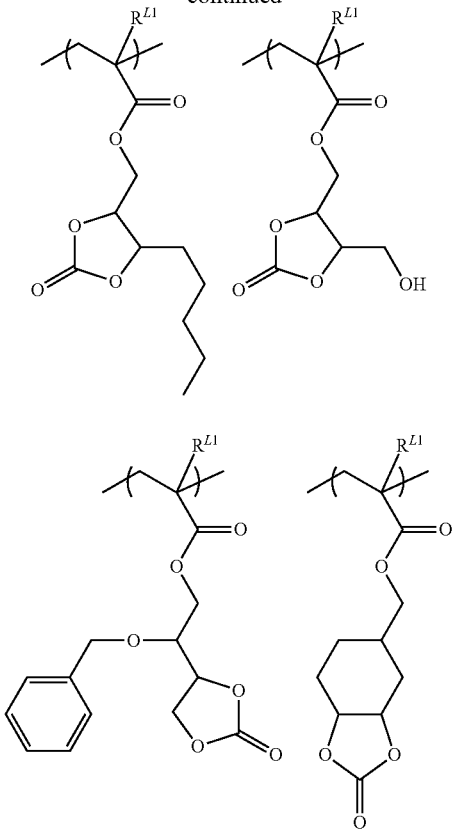
In the above formulae, $R^{L1}$ represents a hydrogen atom, a fluorine atom, a methyl group or a trifluoromethyl group.
Examples of the structural unit having a cyclic carbonate group include structural units represented by the following formulae.
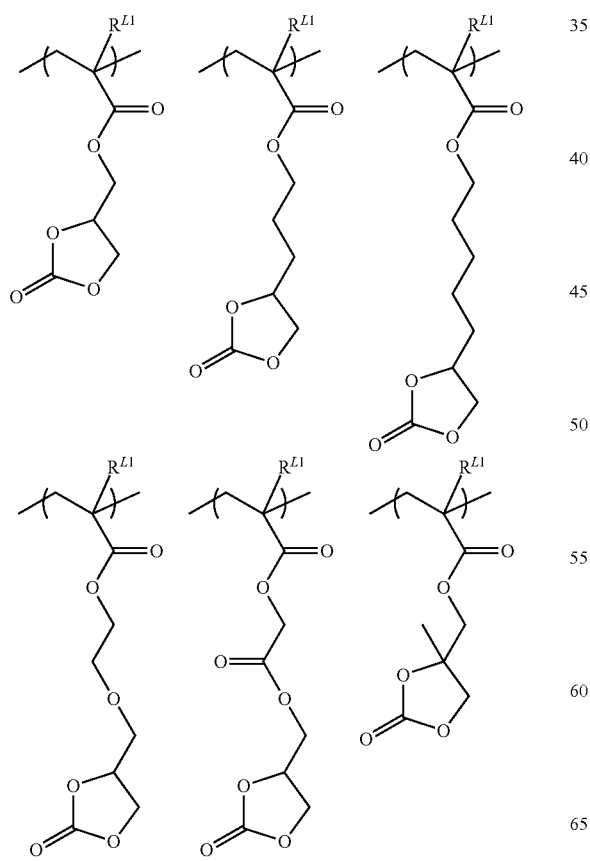
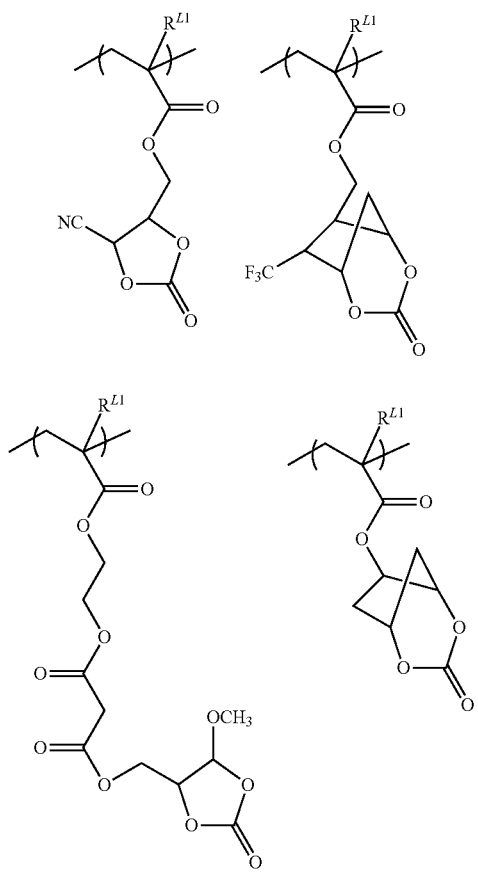

-continued

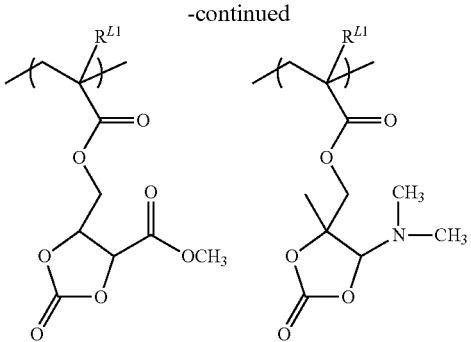

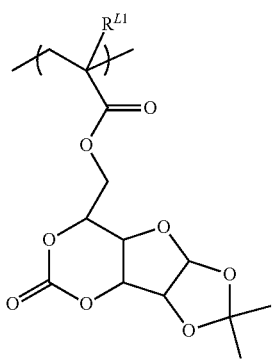

In the above formulae, $R^{L1}$ represents a hydrogen atom, a fluorine atom, a methyl group or a trifluoromethyl group.

The proportion of the structural unit (III) included in the polymer component (A) with respect to the entire structural units constituting the polymer component (A) is preferably 10 mol % to 80 mol %, more preferably 20 mol % to 70 mol %, and still more preferably 25 mol % to 60 mol %. When the proportion of the structural unit (III) included is less than 10 mol %, improvement of the adhesiveness of the resist coating film to a substrate and the like may fail. On the other hand, when the proportion of the structural unit (III) included exceeds 80 mol %, the pattern formation properties may be deteriorated. It is to be noted that the polymer component (A) may include one, or two or more types of the structural unit (III).

Other Structural Unit

The polymer component (A) may further have, in addition to the structural units (I) to (III) described above, other structural unit such as a structural unit having a hydroxyl group not included in the structural unit (I) and the structural unit (II).

Proportion of the Structural Unit Having a Hydroxyl Group

In the embodiment of the present invention, a proportion of the structural unit having a hydroxyl group in the polymer component (A) should be necessarily less than 5 mol % with respect to the entire structural units constituting the polymer component (A). When the proportion of the structural unit having a hydroxyl group in the polymer component (A) is less than 5 mol %, owing to a synergistic effect with the aforementioned ratio of the hydrocarbon group (a2) to the hydrocarbon group (a1) being less than the given value, achieving both superior etching resistance and inhibition of the film loss after pattern formation of the resulting resist coating film is enabled. Moreover, in addition to inhibition of the film loss, a change in polarity of the polymer component (A) after dissociation of the acid-labile group of the polymer component (A) can be more increased, and as a result, lithography characteristics such as CDU can be improved.

In the resist pattern-forming method according to the embodiment of the present invention, reasons for exhibiting the effects described above when a proportion of the structural unit having a hydroxyl group in the polymer component (A) is adjusted to be less the above value are not necessarily clear. However, it may be considered that, for example, the content of carbon of the polymer component (A) is increased, and an interaction of the hydroxyl group with the carboxyl group generated at the light-exposed site, which interaction being presumed to account for the film loss. Moreover, also in regard to the reasons for improvement of lithography characteristics such as CDU, it is considered that, for example, a contrast between dissolution at the light-exposed site and at the light-unexposed site further increased by adjusting the proportion of the hydroxyl group to be less than a given value. It is believed that both superior etching resistance and inhibition of the film loss are achieved, and superior lithography characteristics such as CDU are exhibited owing to a synergistic effect resulting from these reasons and the aforementioned ratio of the hydrocarbon group (a2) to the hydrocarbon group (a1) falling within the specified range.

The structural unit having a hydroxyl group is not particularly limited when it constitutes the polymer component (A) as long as the structural unit has a hydroxyl group, and may be either the structural unit (I) or the structural unit (II), or may be a structural unit other than these. The number of the hydroxyl group in the structural unit having a hydroxyl group may be one, or two or greater, and in light of a great change in polarity of the polymer component (A) after formation of the resist pattern, the number of the hydroxyl group is preferred as small as possible, more preferably no greater than two, and particularly preferably one. Also, the position of the hydroxyl group in the structural unit having a hydroxyl group is not particularly limited.

The proportion of the structural unit having a hydroxyl group in the polymer component (A) is preferably no greater than 4 mol %, more preferably no greater than 2 mol %, and particularly preferably 0 mol %. In other words, it is particularly preferred that the polymer component (A) does not have a structural unit having a hydroxyl group.

Specific examples of the structural unit having a hydroxyl group include in addition to those exemplified as the structural unit (I) and the structural unit (II) above, for example, structural units represented by the following formulae.

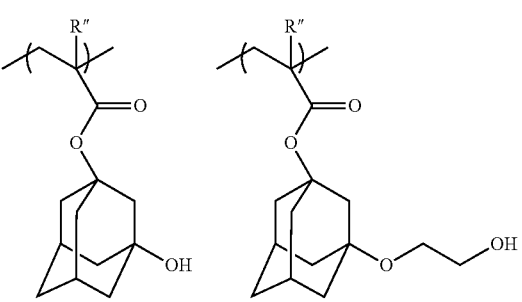

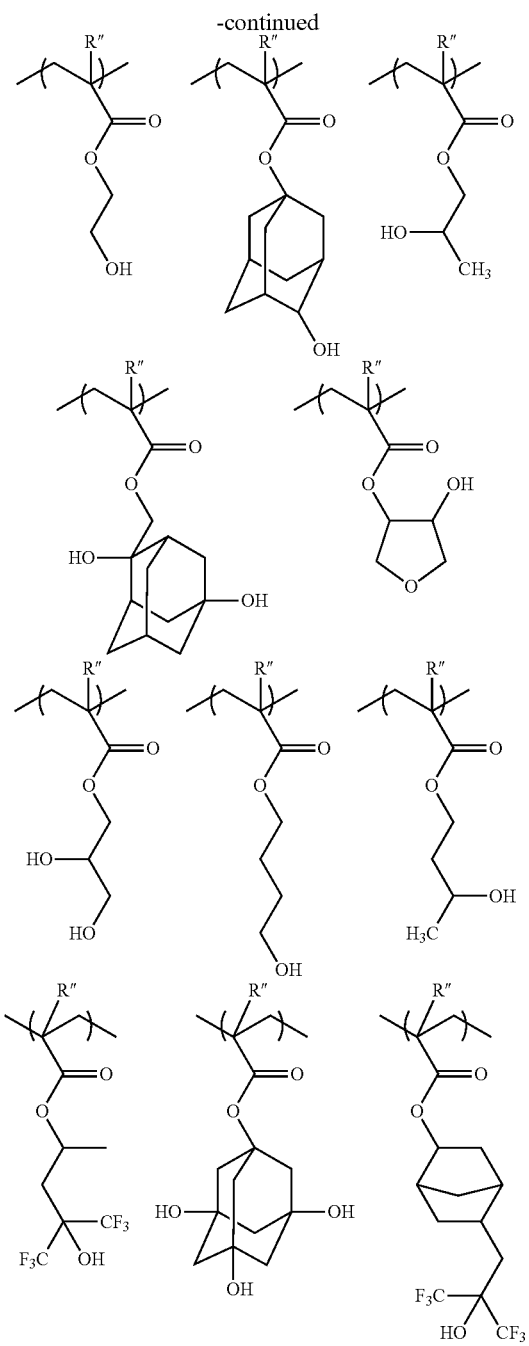

In the above formulae, R″ represents a hydrogen atom, a fluorine atom, a methyl group or a trifluoromethyl group.

Synthesis Method of Polymer Component (A)

The polymer constituting the polymer component (A) may be prepared, for example, by polymerizing the monomer that corresponds to each predetermined structural unit in an appropriate solvent using a radical polymerization initiator. The polymer (A) is preferably synthesized according to a method such as, e.g.: a method in which a solution containing a monomer and a radical initiator is added dropwise to a solution containing a reaction solvent or a monomer to permit a polymerization reaction; a method in which a solution containing a monomer, and a solution containing a radical initiator are each separately added dropwise to a solution containing a reaction solvent or a monomer to permit a polymerization reaction; and a method in which a plurality of solutions each containing a monomer, and a solution containing a radical initiator are each separately added dropwise to a solution containing a reaction solvent or a monomer to permit a polymerization reaction.

The resin obtained by the polymerization reaction may be recovered preferably by a reprecipitation technique. More specifically, after the polymerization reaction is completed, the polymerization mixture is charged into a solvent for reprecipitation, whereby a target resin is recovered in the form of powder. As the reprecipitation solvent, an alcohol, an alkane or the like may be used either alone or as a mixture of two or more thereof. Alternatively to the reprecipitation technique, liquid separating operation, column operation, ultrafiltration operation or the like may be employed to recover the resin through eliminating low molecular components such as monomers and oligomers.

The polystyrene equivalent weight average molecular weight (Mw) of the polymer component (A) as determined by gel permeation chromatography (GPC) is not particularly limited, and preferably no less than 1,000 and no greater than 500,000, more preferably no less than 2,000 and no greater than 400,000, and particularly preferably no less than 3,000 and no greater than 300,000. When the Mw is less than 1,000, heat resistance when prepared to give a resist tends to be impaired. On the other hand, when the Mw of the polymer component (A) exceeds 500,000, developability when prepared to give a resist tends to be decreased.

Furthermore, the ratio (Mw/Mn) of Mw to the polystyrene equivalent number average molecular weight (Mn) as determined by GPC of the polymer component (A) is typically 1 or greater and 5 or less, preferably 1 or greater and 3 or less, and more preferably 1 or greater and 2 or less. When the ratio Mw/Mn falls within such a range, the resist coating film may be superior in resolving performances.

The Mw and Mn as referred to herein mean values determined by GPC using GPC columns (manufactured by Tosoh Corporation, "G2000 HXL"×2, "G3000 HXL"×1 and "G4000 HXL"×1), under conditions involving a flow rate of 1.0 mL/min, an elution solvent of tetrahydrofuran and a column temperature of 40° C., and with monodisperse polystyrene as a standard.

(B) Acid Generator

The acid generator (B) generates an acid upon exposure, and the acid allows an acid-labile group present in the polymer (A) to be dissociated to generate an acid. The mode of incorporation of the acid generator (B) into the radiation-sensitive resin composition may be a form of being incorporated as a compound as described below (hereinafter, may be referred to as "acid generating agent (B)"), a form of being incorporated as a part of a polymer, or a combination of these two forms.

The acid generating agent (B) is exemplified by an onium salt compound, a sulfonimide compound, a halogen-containing compound, a diazo ketone compound, and the like. Of these acid generating agents (B), an onium salt compound is preferred.

Examples of the onium salt compound include sulfonium salts (including tetrahydrothiophenium salts), iodonium salts, phosphonium salts, diazonium salts, pyridinium salts, and the like.

Examples of the sulfonium salt include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium camphorsulfonate, 4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium camphorsulfonate, 4-methanesulfonylphenyldiphenylsulfonium trifluoromethanesulfonate, 4-methanesulfonylphenyldiphenylsulfonium nonafluoro-n-butanesulfonate, 4-methanesulfonylphenyldiphenylsulfonium perfluoro-n-octanesulfonate, 4-methanesulfonylphenyldiphenylsulfonium 2-bicyclo[2.2.1]hept-2-yl-1,1,2,2-tetrafluoroethanesulfonate, 4-methanesulfonylphenyldiphenylsulfonium camphorsulfonate, triphenylphosphonium 1,1,2,2-tetrafluoro-6-(1-adamantanecarbonyloxy)-hexane-1-sulfonate, and the like. Among these, triphenylsulfonium trifluoromethanesulfonate, triphenylsulfonium nonafluoro-n-butanesulfonate, 2-adamantyl-1,1-difluoroethane-1-sulfonate, 2-adamantyl-1,1-difluoroethane-1-sulfonate and triphenylphosphonium 1,1,2,2-tetrafluoro-6-(1-adamantanecarbonyloxy)-hexane-1-sulfonate are preferred.

Examples of the tetrahydrothiophenium salt include 1-(4-n-butoxynaphthalen-1-yl)tetrahydrothiophenium trifluoromethanesulfonate, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate, 1-(4-n-butoxynaphthalen-1-yl)tetrahydrothiophenium 2-bicyclo[2.2.1]hept-2-yl-1,1,2,2-tetrafluoroethanesulfonate, 1-(4-n-butoxynaphthalen-1-yl)tetrahydrothiophenium camphorsulfonate, 1-(6-n-butoxynaphthalen-2-yl)tetrahydrothiophenium trifluoromethanesulfonate, 1-(6-n-butoxynaphthalen-2-yl)tetrahydrothiophenium nonafluoro-n-butanesulfonate, 1-(6-n-butoxynaphthalen-2-yl)tetrahydrothiophenium perfluoro-n-octanesulfonate, 1-(6-n-butoxynaphthalen-2-yl)tetrahydrothiophenium 2-bicyclo[2.2.1]hept-2-yl-1,1,2,2-tetrafluoroethanesulfonate, 1-(6-n-butoxynaphthalen-2-yl)tetrahydrothiophenium camphorsulfonate, 1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium camphorsulfonate, and the like. Among these tetrahydrothiophenium salts, 1-(4-n-butoxynaphthalen-1-yl)tetrahydrothiophenium nonafluoro-n-butanesulfonate, 1-(4-n-butoxynaphthalen-1-yl)tetrahydrothiophenium perfluoro-n-octanesulfonate and 1-(3,5-dimethyl-4-hydroxyphenyl)tetrahydrothiophenium nonafluoro-n-butanesulfonate are preferred.

Examples of the iodonium salt include diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium camphorsulfonate, and the like. Among these iodonium salts, bis(4-t-butylphenyl)iodonium nonafluoro-n-butanesulfonate is preferred.

Examples of the sulfonimide compound include N-(trifluoromethanesulfonyloxy)bicyclo[2.2.1]hept-5-ene-2,3-dicarboxylmide, N-(nonafluoro-n-butanesulfonyloxy)bicyclo[2.2.1]hept-5-ene-2,3-dicarboxylmide, N-(perfluoro-n-octanesulfonyloxy)bicyclo[2.2.1]hept-5-ene-2,3-dicarboxylmide, N-(2-bicyclo[2.2.1]hept-2-yl-1,1,2,2-tetrafluoroethanesulfonyloxy)bicyclo[2.2.1]hept-5-ene-2,3-dicarboxylmide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxylmide, N-(camphorsulfonyloxy)bicyclo[2.2.1]hept-5-ene-2,3-dicarboxylmide, and the like. Among these sulfonimide compounds, N-(trifluoromethanesulfonyloxy)bicyclo[2.2.1]hept-5-ene-2,3-dicarboxylmide is preferred.

The acid generator (B) is preferably represented by the above formula (B-1).

Due to having an alicyclic structure, similarly to the polymer component (A) described above, the acid generator (B) represented by the above formula (B-1) has increased miscibility with the polymer component (A) in the radiation-sensitive resin composition, thereby leading to improvement of dispersibility. In addition, diffusion in the resist coating film is appropriately controlled. As a result, lithography characteristics such as CDU of the resultant resist pattern can be improved.

In the above formula (B-1), $Rf^1$ and $Rf^2$ each independently represent a hydrogen atom, a fluorine atom, or a fluorinated alkyl group having 1 to 4 carbon atoms; n is an integer of 1 to 3, wherein any case in which $Rf^1$ and $Rf^2$ bonded to carbon at an α-position of the sulfonate group both represent a hydrogen atom is excluded, and in a case where $Rf^1$ and $Rf^2$ are each present in a plurality of number, a plurality of $Rf^1$s are each identical or different and a plurality of $Rf^2$s are each identical or different; $R^r$ represents a monovalent organic group having 3 to 20 carbon atoms and having an alicyclic structure; and $X^+$ represents a monovalent cation.

Examples of the fluorinated alkyl group having 1 to 4 carbon atoms represented by $Rf^1$ and $Rf^2$ include a fluoromethyl group, a difluoromethyl group, a trifluoromethyl group, a fluoroethyl group, a difluoroethyl group, a trifluoroethyl group, a perfluoroethyl group, a fluoropropyl group, a difluoropropyl group, a trifluoropropyl group, a pentafluoropropyl group, a hexafluoropropyl group, a perfluoropropyl group, a fluorobutyl group, a difluorobutyl group, a trifluorobutyl group, a tetrafluorobutyl group, a pentafluorobutyl group, a perfluorobutyl group, and the like.

Examples of the monovalent organic group having an alicyclic structure represented by $R^r$ include a cyclopentyl group, a cyclohexyl group, a 1-norbornyl group, a 2-norbornyl group, a 1-norbornenyl group, a 2-norbornenyl group, a 1-adamantyl group, a 2-adamantyl group, a furyl group and the like, and a methylene group or an alkylene group such as an ethylene group, a propylene group or a butylene group, to which a cyclopentyl group, a cyclohexyl group, a 1-norbornyl group, a 2-norbornyl group, a 1-norbornenyl group, a 2-norbornenyl group, a 1-adamantyl group, a 2-adamantyl group or a furyl group bonds, and the like. Of these, groups having a polycyclic alicyclic structure such as a norbornyl group and an adamantyl group are preferred, and groups having an adamantyl group are more preferred.

A part or all of hydrogen atoms included in $R^r$ are not substituted or substituted by a substituent. Examples of the substituent include a hydroxyl group, a carboxyl group, an alkylcarbonyl group, a cyano group, a nitro group, a sulfonamide group, and the like. Moreover, keto groups formed by substituting two hydrogen atoms bonded to an identical carbon atom of $R^r$ are also exemplified.

The monovalent organic group having an alicyclic structure represented by R$^r$ is preferably the group represented by the above formula (i).

In the above formula (i), A represents a linking group having a valency of (m+1); m is an integer of 1 to 3; and R$^{r1}$ represents a monovalent organic group having 3 to 20 carbon atoms and having an alicyclic structure.

Examples of the linking group having a valency of (m+1) represented by A include:

divalent linking groups such as an ester group, an ether group, a carbonyl group, an amide group, an imino group, an alkanediyl group, a cycloalkanediyl group, an arylene group and an aralkylene group;

trivalent linking groups such as an alkanetriyl group, a cycloalkanetriyl group and an arenetriyl group;

tetravalent linking groups such as an alkanetetrayl group, a cycloalkanetetrayl group and an arenetetrayl group.

Examples of the monovalent organic group having 3 to 20 carbon atoms and having an alicyclic structure represented by R$^{r1}$ include those exemplified in connection with R$^r$ described above.

The cation represented by X$^+$ onium cations of sulfur, iodine, phosphorus, nitrogen and the like, and specific examples include a sulfonium cation, a tetrahydrothiophenium cation, an iodonium cation, a phosphonium cation, a diazonium cation, a pyridinium cation, and the like. Of these, a sulfonium cation and a tetrahydrothiophenium cation are preferred, and a sulfonium cation is more preferred.

Examples of preferred acid generator (B) include those represented by the following formulae.

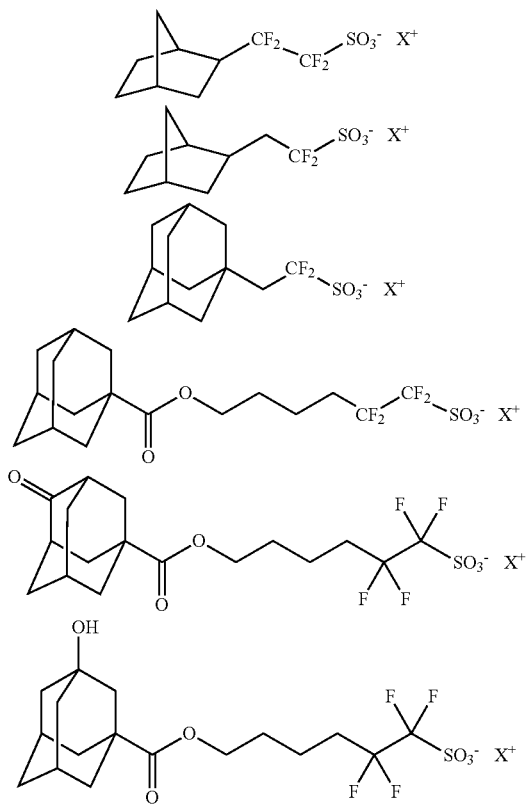
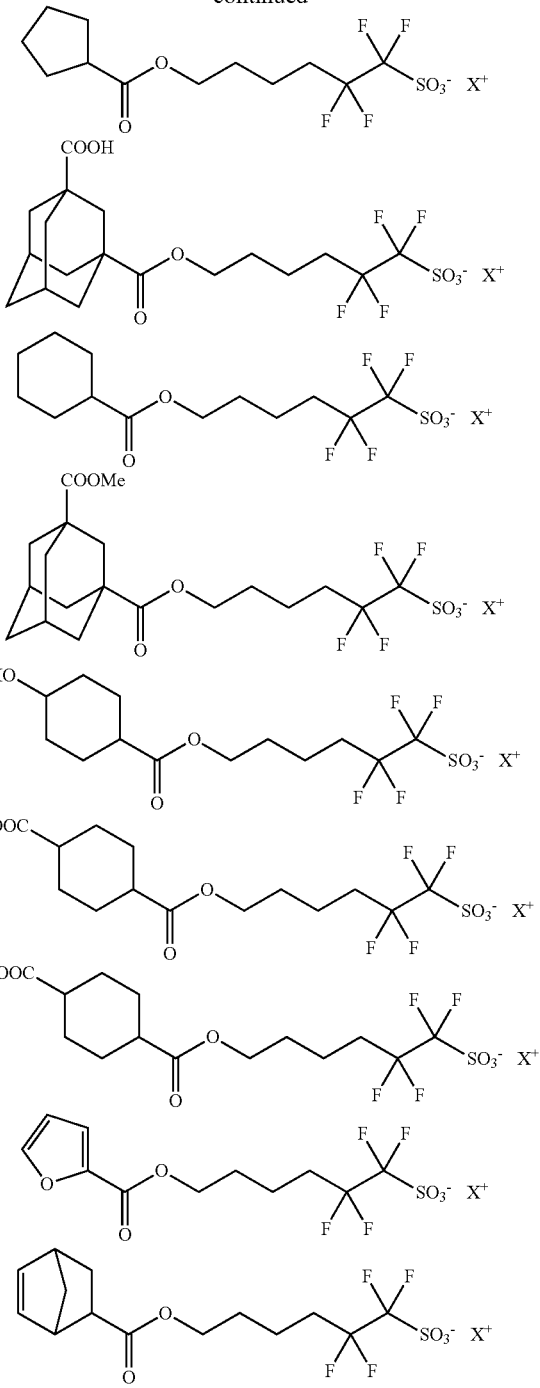

In the above formulae, X$^+$ represents a monovalent cation.

These acid generators (B) may be used either alone, or in combination of two or more thereof. The amount of the acid generator (B) employed in the case of the acid generator (B) being the acid generating agent is typically no less than 0.1 parts by mass and no greater than 20 parts by mass, and preferably no less than 0.5 parts by mass and no greater than 15 parts by mass with respect to 100 parts by mass of the polymer component (A) in view of ensuring the sensitivity and developability for use as a resist. In this case, when the amount of the acid generating agent (B) employed is less than 0.1 parts by mass, the sensitivity and developability tend to be deteriorated, whereas the amount of the acid generating agent (B) exceeding 15 parts by mass is likely to result in reduction of radiation transmittance, and to render the formation of the desired resist patterns difficult.

Fluorine Atom-Containing Polymer

The radiation-sensitive resin composition may contain a fluorine atom-containing polymer (excluding the polymer component (A)). When the radiation-sensitive resin composition contains the fluorine atom-containing polymer, the polymer tends to be unevenly distributed in the vicinity of the surface of the resist coating film in forming the resist coating film, due to an oil repellent feature of the fluorine atom-containing polymer in the film. Thus, elution of the acid generating agent, the acid diffusion control agent, etc., into the liquid immersion medium during liquid immersion lithography can be inhibited. In addition, owing to a water repellent feature of the fluorine atom-containing polymer, an advancing contact angle of a liquid immersion medium on a resist coating film can be controlled to fall within a desired range, whereby formation of bubble defects can be suppressed. Furthermore, a receding contact angle of a liquid immersion medium on a resist coating film increases, thereby enabling exposure by high-speed scanning without remaining water droplets. The radiation-sensitive resin composition thus containing the fluorine atom-containing polymer enables a resist coating film to be formed which is suitable for a liquid immersion lithography process.

The fluorine atom-containing polymer is not particularly limited as long as it contains a fluorine atom, and preferably has the content of fluorine atoms (% by mass) greater than that of the polymer component (A). The content of fluorine atoms being greater than that of the polymer component (A), leads to a higher degree of uneven distribution, whereby characteristics such as water repellency and elution-inhibiting properties the resultant resist coating film can be improved.

The fluorine atom-containing polymer is prepared by polymerizing one or more types of monomers that include a fluorine atom in the structure thereof.

The monomers that include a fluorine atom in the structure thereof are exemplified by a monomer that includes a fluorine atom in its main chain, a monomer that includes a fluorine atom in its side chain, and a monomer that includes a fluorine atom in its main chain and side chain.

Examples of the monomer that gives a polymer including a fluorine atom in its main chain include α-fluoroacrylate compounds, α-trifluoromethyl acrylate compounds, β-fluoroacrylate compounds, β-trifluoromethyl acrylate compounds, α,β-fluoroacrylate compounds, α,β-trifluoromethyl acrylate compounds, compounds derived by substituting a hydrogen atom of one or more types of vinyl moieties by a fluorine atom, a trifluoromethyl group, etc., and the like.

Examples of the monomer that gives a polymer including a fluorine atom in its side chain include compounds in which an alicyclic olefin compound such as norbornene has fluorine, a fluoroalkyl group and/or a derivative thereof as a side chain, ester compounds of acrylic acid or methacrylic acid with a fluoroalkyl group and/or a derivative thereof, olefins having a fluorine atom, a fluoroalkyl group and/or a derivative thereof as one or more types of side chain (a site excluding a double bond), and the like.

Examples of the monomer that gives a polymer including a fluorine atom in its main chain and side chain include ester compounds of α-fluoroacrylic acid, β-fluoroacrylic acid, α,β-fluoroacrylic acid, α-trifluoromethyl acrylic acid, β-trifluoromethyl acrylic acid, α,β-trifluoromethylacrylic acid or the like with a fluoroalkyl group and/or a derivative thereof, compounds derived by substituting hydrogen atom(s) of one or more types of vinyl moieties by a fluorine atom or a trifluoromethyl group and substituting a side chain of the compound with a fluorine atom, a fluoroalkyl group and/or a derivative thereof; alicyclic olefin compounds derived by substituting hydrogen atom(s) bonded to one or more types of double bonds by a fluorine atom or a trifluoromethyl group, etc., and having a fluorinated alkyl group and/or a derivative thereof as a side chain; and the like. The alicyclic olefin compound as referred to herein means a compound that includes a double bond in a part of its ring.

The structural unit included in the fluorine atom-containing polymer is exemplified by a structural unit (hereinafter, may be also referred to as "structural unit (F-I)") represented by the following formula (F1).

(F1)

In the above formula (F1), $R^3$ represents a hydrogen atom, a fluorine atom, a methyl group or a trifluoromethyl group; E represents a divalent linking group; and $R^4$ represents a linear or branched alkyl group having 1 to 6 carbon atoms, or a monovalent alicyclic hydrocarbon group having 4 to 20 carbon atoms or derivative groups thereof, having at least one fluorine atoms.

Examples of the divalent linking group represented by E include a single bond, an oxygen atom, a sulfur atom, a carbonyloxy group, an oxycarbonyl group, an amide group, a sulfonylamide group, a urethane group, and the like.

Examples of monomers which give the above structural unit (F-I) include (meth)acrylic acid trifluoromethyl ester, (meth)acrylic acid 2,2,2-trifluoroethyl ester, (meth)acrylic acid perfluoroethyl ester, (meth)acrylic acid perfluoro-n-propyl ester, (meth)acrylic acid perfluoro-1-propyl ester, (meth)acrylic acid perfluoro-n-butyl ester, (meth)acrylic acid perfluoro-1-butyl ester, (meth)acrylic acid perfluoro-t-butyl ester, (meth)acrylic acid 2-(1,1,1,3,3,3-hexafluoropropyl)ester, (meth)acrylic acid 1-(2,2,3,3,4,4,5,5-octafluoropentyl)ester, (meth)acrylic acid perfluorocyclohexylmethyl ester, (meth)acrylic acid 1-(2,2,3,3,3-pentafluoropropyl)ester, (meth)acrylic acid 1-(3,3,4,4,5,5,6,6,7,7,8,8,9,9,10,10,10-heptadecafluorodecyl)ester, (meth)acrylic acid 1-(5-trifluoromethyl-3,3,4,4,5,6,6,6-octafluorohexyl)ester, and the like.

The fluorine atom-containing polymer may include only one type or two or more types of the structural unit (F-I). The proportion of the structural unit (F-I) included with respect to 100 mol % of the entire structural units in fluorine atom-containing polymer is typically no less than 5 mol %, preferably no less than 10 mol %, and more preferably no less than 15 mol %. When the proportion of the structural unit (F-I) included is less than 5 mol %, the receding contact angle of no less than 70° may not be achieved, and/or elution of the acid generating agent and the like from the resist coating film may not be suppressed.

In addition to the structural unit (F-I), the fluorine atom-containing polymer may include at least one type of "other structural units" such as, for example: in order to control rates of dissolution in developer solutions, a structural unit having a group such as an acid-labile group, a structural unit having a lactone group, a cyclic carbonate group, a hydroxyl group or a carboxyl group, or an alicyclic structure; and/or a structural unit derived from an aromatic compound.

The other structural unit having an acid-labile group is exemplified by similar structural units having an acid-labile group exemplified in connection with the above structural unit (I) and structural unit (II) in the polymer component (A). The other structural unit having a lactone group and/or a cyclic carbonate group is exemplified by similar structural units to the structural unit (III) in the polymer component (A). The other structural unit having a hydroxyl group is exemplified by similar structural units having a hydroxyl group exemplified in connection with the above structural unit (I), structural unit (II), etc., in the polymer component (A).

The other structural unit having an alicyclic structure (hereinafter, may be also referred to as "structural unit (F-II)") is exemplified by a structural unit represented by the following formula (F2).

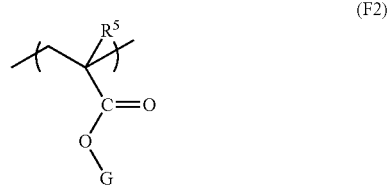

(F2)

In the above formula (F2), $R^5$ represents a hydrogen atom, a fluorine atom, a methyl group, or a trifluoromethyl group; and G represents an alicyclic hydrocarbon group having 4 to 20 carbon atoms.

The alicyclic hydrocarbon group having 4 to 20 carbon atoms represented by G is exemplified by hydrocarbon groups having an alicyclic ring derived from a cycloalkane such as cyclobutane, cyclopentane, cyclohexane, bicyclo[2.2.1]heptane, bicyclo[2.2.2]octane, tricyclo[5.2.1.0$^{2,6}$]decane, tetracyclo[6.2.1.1$^{3,6}$.0$^{2,7}$]dodecane, tricyclo[3.3.1.1$^{3,7}$]decane. The cycloalkane-derived alicyclic ring may have a substituent, and is optionally substituted with at least one or at least one type of a linear, branched or cyclic alkyl group having 1 to 4 carbon atoms such as, for example, a methyl group, an ethyl group, a n-propyl group, an i-propyl group, a n-butyl group, a 2-methylpropyl group, a 1-methylpropyl group, a t-butyl group.

Examples of monomers which give the above structural unit (F-II) include (meth)acrylic acid bicyclo[2.2.1]hept-2-yl ester, (meth)acrylic acid bicyclo[2.2.2]oct-2-yl ester, (meth)acrylic acid tricyclo[5.2.1.0$^{2,6}$]dec-7-yl ester, (meth)acrylic acid tetracyclo[6.2.1.1$^{3,6}$.0$^{2,7}$]dodec-9-yl ester, (meth)acrylic acid tricyclo[3.3.1.1$^{3,7}$]dec-1-yl ester, (meth)acrylic acid tricyclo[3.3.1.1$^{3,7}$]dec-2-yl ester, and the like.

The proportion of the other structural unit included in the fluorine atom-containing polymer with respect to 100 mol % of the entire structural units in the fluorine atom-containing polymer is typically no greater than 80 mol %, preferably no greater than 75 mol %, and more preferably no greater than 70 mol %.

The Mw of the fluorine atom-containing polymer is preferably 1,000 to 50,000, more preferably 1,000 to 30,000, and particularly preferably 1,000 to 10,000. When the Mw of the fluorine atom-containing polymer is less than 1,000, it is impossible to attain a sufficient advancing contact angle. On the other hand, the Mw of the fluorine atom-containing polymer exceeding 50,000 is likely to result in deteriorated developability of the resultant resist.

A ratio of Mw to Mn (Mw/Mn) of the fluorine atom-containing polymer is typically 1 to 3, and preferably 1 to 2.

The content of the fluorine atom-containing polymer in the radiation-sensitive resin composition with respect to 100 parts by mass of the polymer component (A) is preferably 0 to 50 parts by mass, more preferably 0 to 20 parts by mass, still more preferably 1 to 10 parts by mass, and particularly preferably 2 to 8 parts by mass. When the content of the fluorine atom-containing polymer in the radiation-sensitive resin composition falls within the above range, water repellency and elution-inhibiting properties of the surface of the resultant resist coating film can be further improved.

Synthesis Method of Fluorine Atom-Containing Polymer

The fluorine atom-containing polymer may be synthesized, for example, by polymerizing the monomer that gives each predetermined structural unit in an appropriate solvent using a radical polymerization initiator.

Solvent

In general, the radiation-sensitive resin composition contains a solvent. The solvent is not particularly limited as long as it can dissolve or disperse at least the polymer component (A) and the acid generator (B) described above, and optional components added as needed. The solvent is exemplified by an alcohol solvent, a ketone solvent, an amide solvent, an ether solvents, an ester solvent and a mixed solvent thereof, and the like.

Examples of the alcohol solvent include:

monohydric alcohol solvents such as methanol, ethanol, n-propanol, iso-propanol, n-butanol, iso-butanol, sec-butanol, tert-butanol, n-pentanol, iso-pentanol, 2-methylbutanol, sec-pentanol, tert-pentanol, 3-methoxybutanol, n-hexanol, 2-methylpentanol, sec-hexanol, 2-ethylbutanol, sec-heptanol, 3-heptanol, n-octanol, 2-ethylhexanol, sec-octanol, n-nonyl alcohol, 2,6-dimethyl-4-heptanol, n-decanol, sec-undecyl alcohol, trimethylnonyl alcohol, sec-tetradecyl alcohol, sec-heptadecyl alcohol, furfuryl alcohol, phenol, cyclohexanol, methylcyclohexanol, 3,3,5-trimethylcyclohexanol, benzyl alcohol and diacetone alcohol;

polyhydric alcohol solvents such as ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol and tripropylene glycol;

partially etherified polyhydric alcohol solvents such as ethylene glycol monomethyl ether, ethylene glycol monoethyl ether, ethylene glycol monopropyl ether, ethylene glycol monobutyl ether, ethylene glycol monohexyl ether, ethylene glycol monophenyl ether, ethylene glycol mono-2-ethylbutyl ether, diethylene glycol monomethyl ether, diethylene glycol monoethyl ether, diethylene glycol monopropyl ether, diethylene glycol monobutyl ether, diethylene glycol monohexyl ether, propylene glycol monomethyl ether, propylene glycol monoethyl ether, propylene glycol monopropyl ether, propylene glycol monobutyl ether, dipropylene glycol monomethyl ether, dipropylene glycol monoethyl ether and dipropylene glycol monopropyl ether, and the like.

Examples of the ketone solvent include acetone, methyl ethyl ketone, methyl n-propyl ketone, methyl n-butyl ketone, diethyl ketone, methyl isobutyl ketone, methyl n-pentyl ketone, ethyl n-butyl ketone, methyl n-hexyl ketone, di-isobutyl ketone, trimethylnonane, cyclopentanone, cyclohexanone, cycloheptanone, cyclooctanone, methylcyclohexanone, 2,4-pentanedione, acetonyl acetone, diacetone alcohol, acetophenone, and the like.

Examples of the amide solvent include N,N'-dimethylimidazolidinone, N-methylformamide, N,N-dimethylformamide, N,N-diethylformamide, acetamide, N-methylacetamide, N,N-dimethylacetamide, N-methylpropionamide, N-methylpyrrolidone, and the like.

Examples of the ester solvent include diethyl carbonate, propylene carbonate, methyl acetate, ethyl acetate, γ-butyrolactone, γ-valerolactone, n-propyl acetate, isopropyl acetate, n-butyl acetate, isobutyl acetate, sec-butyl acetate, n-pentyl acetate, sec-pentyl acetate, 3-methoxybutyl acetate, methylpentyl acetate, 2-ethylbutyl acetate, 2-ethylhexyl acetate, benzyl acetate, cyclohexyl acetate, methylcyclohexyl acetate, n-nonyl acetate, methyl acetoacetate, ethyl acetoacetate, ethylene glycol monomethyl ether acetate, ethylene glycol monoethyl ether acetate, diethylene glycol monomethyl ether acetate, diethylene glycol monoethyl ether acetate, diethylene glycol mono-n-butyl ether acetate, propylene glycol monomethyl ether acetate, propylene glycol monoethyl ether acetate, propylene glycol monopropyl ether acetate, propylene glycol monobutyl ether acetate, dipropylene glycol monomethyl ether acetate, dipropylene glycol monoethyl ether acetate, diglycol acetate, methoxytriglycol acetate, ethyl propionate, n-butyl propionate, iso-amyl propionate, diethyl oxalate, di-n-butyl oxalate, methyl lactate, ethyl lactate, n-butyl lactate, n-amyl lactate, diethyl malonate, dimethyl phthalate, diethyl phthalate, and the like.

Examples of the other solvent include:

aliphatic hydrocarbon solvents such as n-pentane, iso-pentane, n-hexane, iso-hexane, n-heptane, iso-heptane, 2,2,4-trimethylpentane, n-octane, iso-octane, cyclohexane and methylcyclohexane;

aromatic hydrocarbon solvents such as benzene, toluene, xylene, mesitylene, ethylbenzene, trimethylbenzene, methylethylbenzene, n-propylbenzene, isopropylbenzene, diethylbenzene, isobutylbenzene, triethylbenzene, di-isopropylbenzene and n-amylnaphthalene;

halogen-containing solvents such as dichloromethane, chloroform, chlorofluorocarbon, chlorobenzene and dichlorobenzene;

carbonate ester solvents such as ethylene carbonate and propylene carbonate, and the like.

Of these solvents, ester solvents and ketone solvents are preferred, and propylene glycol monomethyl ether acetate, cyclohexanone and γ-butyrolactone are more preferred. These solvents may be used either alone, or in combination of two or more thereof.

Acid Diffusion Controller

The acid diffusion controller exerts the effect of controlling diffusion phenomenon of the acid generated from the acid generator (B) upon the exposure in the resist coating film, and suppressing unfavorable chemical reactions in unexposed regions; as a result, storage stability of the resultant radiation-sensitive resin composition is further improved, and resolution of the resist is further improved, while suppressing variation of line width of the resist pattern caused by variation of post-exposure delay (PED) from the exposure until a development treatment, which enables the radiation-sensitive resin composition with superior process stability to be obtained. The mode of incorporation of the acid diffusion controller into the radiation-sensitive resin composition may be in a free compound form (hereinafter, may be referred to as "acid diffusion control agent", as appropriate) or in an incorporated form as a part of the polymer, or in both of these forms.

Examples of the acid diffusion control agent include amine compounds, amide group-containing compounds, urea compounds, nitrogen-containing heterocyclic compounds, and the like.

Examples of the amine compounds include mono(cyclo)alkylamines; di(cyclo)alkylamines; tri(cyclo)alkylamines; substituted alkylaniline or derivatives thereof; ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, 2,2-bis(4-aminophenyl)propane, 2-(3-aminophenyl)-2-(4-aminophenyl)propane, 2-(4-aminophenyl)-2-(3-hydroxyphenyl)propane, 2-(4-aminophenyl)-2-(4-hydroxyphenyl)propane, 1,4-bis(1-(4-aminophenyl)-1-methylethyl)benzene, 1,3-bis(1-(4-aminophenyl)-1-methylethyl)benzene, bis(2-dimethylaminoethyl)ether, bis(2-diethylaminoethyl)ether, 1-(2-hydroxyethyl)-2-imidazolidinone, 2-quinoxalinol, N,N,N',N'-tetrakis(2-hydroxypropyl)ethylenediamine, N,N,N',N''N''-pentamethyldiethylenetriamine, and the like.

Examples of the amide group-containing compound include N-t-butoxycarbonyl group-containing amino compounds, formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, tris(2-hydroxyethyl)isocyanurate, and the like.

Examples of the urea compounds include urea, methylurea, 1,1-dimethylurea, 1,3-dimethylurea, 1,1,3,3-tetramethylurea, 1,3-diphenylurea, tri-n-butylthiourea, and the like.

Examples of the nitrogen-containing heterocyclic compounds include imidazoles; pyridines; piperazines; pyrazine, pyrazole, pyridazine, quinoxaline, purine, pyrrolidine, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, 1,4-diazabicyclo[2.2.2]octane, and the like.

In addition, the acid diffusion control agent may be a photodegradable base which is sensitized upon exposure to generate a weak acid. An example of the photodegradable base includes onium salt compounds which degrade upon the exposure and lose their acid diffusion controllability. Examples of the onium salt compounds include sulfonium salt compounds represented by the following formula (D1), and iodonium salt compounds represented by the following formula (D2).

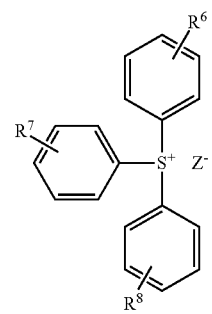

(D1)

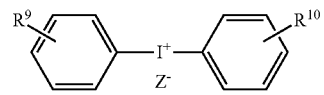

(D2)

In the above formulae (D1) and (D2), $R^6$ to $R^{10}$ each independently represent a hydrogen atom, an alkyl group, an alkoxyl group, a hydroxyl group or a halogen atom; $Z^-$ represents $OH^-$, $R^D$—$COO^-$ or $R^D$—$SO_3^-$, wherein $R^D$ represents an alkyl group, an aryl group, an alkaryl group or an anion represented by the following formula (D3).

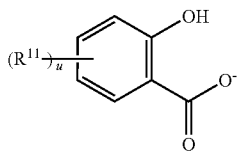

In the above formula (D3), $R^{11}$ represents a linear or branched alkyl group having 1 to 12 carbon atoms, or a linear or branched alkoxyl group having 1 to 12 carbon atoms, wherein a part or all of hydrogen atoms included in the above alkyl group and alkoxyl group are not substituted or substituted by a fluorine atom; and u is an integer of 0 to 2.

The content of the acid diffusion control agent is preferably less than 5 parts by mass with respect to 100 parts by mass of the polymer component (A). When the total amount used exceeds 5 parts by mass, sensitivity as a resist tends to be deteriorated.

Alicyclic Skeleton Compound

The alicyclic skeleton compound is a component which exerts the effect of further improving dry etching resistance, pattern configuration, adhesiveness to a substrate, and the like. Examples of the alicyclic skeleton compound include adamantane derivatives such as 1-adamantanecarboxylic acid, 2-adamantanone and t-butyl 1-adamantanecarboxylate; deoxycholic acid esters such as t-butyl deoxycholate, t-butoxycarbonylmethyl deoxycholate and 2-ethoxyethyl deoxycholate; lithocholic acid esters such as t-butyl lithocholate, t-butoxycarbonylmethyl lithocholate and 2-ethoxyethyl lithocholate; 3-[2-hydroxy-2,2-bis(trifluoromethyl)ethyl]tetracyclo[$4.4.0.1^{2,5}.1^{7,10}$]dodecane, 2-hydroxy-9-methoxycarbonyl-5-oxo-4-oxa-tricyclo[$4.2.1.0^{3,7}$]nonane, and the like.

Surfactant

The surfactant is a component which has the effect of improving coating property, striation, developability and the like. Examples of the surfactant include nonionic surfactants such as polyoxyethylene lauryl ether, polyoxyethylene stearyl ether, polyoxyethylene oleyl ether, polyoxyethylene n-octylphenyl ether, polyoxyethylene n-nonylphenyl ether, polyethylene glycol dilaurate, polyethylene glycol distearate, as well as in terms of trade names, KP341 (manufactured by Shin-Etsu Chemical Co., Ltd.); POLYFLOW No. 75, and No. 95 (each manufactured by Kyoeisha Chemical Co., Ltd.); F-top EF301, EF303, and EF352 (each manufactured by Tochem Products Co. Ltd.); Megafac F171, and F173 (each manufactured by Dainippon Ink And Chemicals, Incorporated); Fluorad FC430, and FC431 (each manufactured by Sumitomo 3M Ltd.); AsahiGuard AG 710, Surflon S-382, SC-101, SC-102, SC-103, SC-104, SC-105, and SC-106 (each manufactured by Asahi Glass Co., Ltd.), and the like. These surfactants may be used either alone, or in combination of two or more thereof.

Sensitizing Agent

The sensitizing agent exhibits the action of absorbing an energy of a radioactive ray and transfers the energy to the acid generating agent (A), thereby increasing the amount of the acid produced, and thus has the effect of improving "apparent sensitivity" of the radiation-sensitive resin composition. Examples of the sensitizing agent include carbazoles, acetophenones, benzophenones, naphthalenes, phenols, biacetyls, eosins, rose bengals, pyrenes, anthracenes, phenothiazines, and the like.

Preparation of Radiation-Sensitive Resin Composition

The radiation-sensitive resin composition may be prepared by mixing, for example, the polymer component (A), the acid generator (B) and the optional component(s) at a certain ratio. Also, it is possible to prepare the radiation-sensitive resin composition in a state of being dissolved or dispersed in an appropriate organic solvent. The organic solvent is not particularly limited and may be any one exemplified as the solvent above, as long as it can dissolve or disperse the polymer component (A), the acid generating agent (B), and the optional component(s). The radiation-sensitive resin composition is usually prepared upon use by dissolving in a solvent, and thereafter filtering the obtained mixture through a filter having a pore size of about 0.20 µm, for example.

Radiation-Sensitive Resin Composition

The radiation-sensitive resin composition of the embodiment of the present invention is for use in a resist pattern-forming method carried out using a developer solution containing no less than 80% by mass of an organic solvent, the radiation-sensitive resin composition containing:

(A) a polymer component including a polymer having an acid-labile group; and (B) a radiation-sensitive acid generator, the polymer component (A) including, in an identical polymer or different polymers, (I) a structural unit having (a1) a hydrocarbon group, and (II) a structural unit having (a2) a hydrocarbon group, the hydrocarbon group (a1) being a unsubstituted or substituted branched chain group having no greater than 8 carbon atoms or an unsubstituted or substituted monocyclic alicyclic group having 3 to 8 carbon atoms, the hydrocarbon group (a2) having an adamantane skeleton, a molar ratio of the hydrocarbon group (a2) to the hydrocarbon group (a1) being less than 1, and a proportion of the structural unit having a hydroxyl group in the polymer component (A) being less than 5 mol %.

Use of the radiation-sensitive resin composition for a resist pattern-forming method carried out using a developer solution containing no less than 80% by mass of an organic solvent enables a resist pattern capable of achieving both superior etching resistance and inhibition of the film loss of a resist coating film, and being superior in lithography characteristics such as CDU to be obtained. Since the radiation-sensitive resin composition is described in connection with the Resist Pattern-Forming Method above, the explanation in this section is omitted.

EXAMPLES

Hereinafter, the present invention will be explained more specifically by way of Examples, but the present invention is not limited to these Examples. Methods of the determination of various types of physical property values are shown below.

Weight Average Molecular Weight (Mw) and Number Average Molecular Weight (Mn)

The Mw and the Mn of the polymer were determined by gel permeation chromatography (GPC) using GPC columns ("G2000 HXL"×2, "G3000 HXL×1, "G4000 HXL"×1) manufactured by Tosoh Corporation under the following conditions.

eluent: tetrahydrofuran (manufactured by Wako Pure Chemical Industries, Ltd.)
flow rate: 1.0 mL/min
sample concentration: 1.0% by mass
amount of injected sample: 100 µL
detector: differential refractometer
standard substance: mono-dispersed polystyrene

$^{13}$C-NMR Analysis:
The analysis was carried out using "JNM-EX400" manufactured by JEOL, Ltd., with DMSO-$d_6$ for use as a solvent for measurement.
Synthesis of Polymer Component (A)
Monomers used in synthesis of the polymers constituting the polymer component (A), and the fluorine atom-containing polymer described later are shown below.
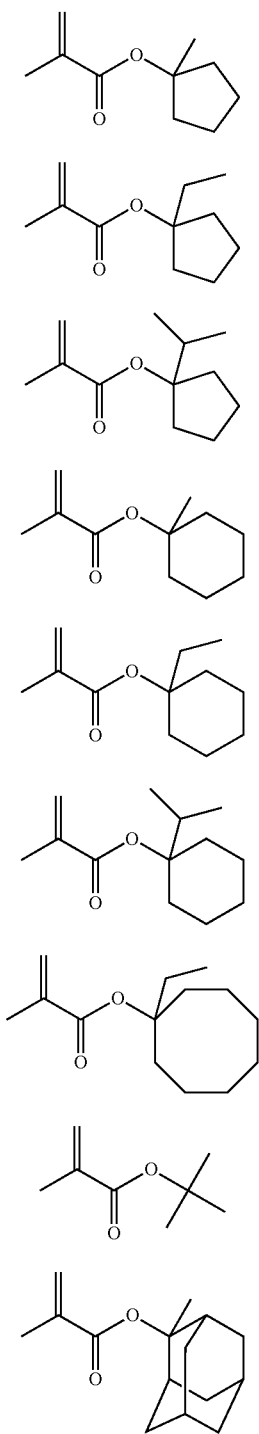
(M-1) (M-2) (M-3) (M-4) (M-5) (M-6) (M-7) (M-8) (M-9)
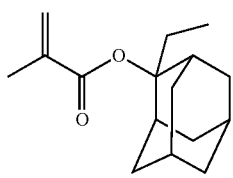
(M-10)
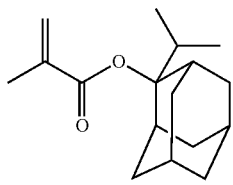
(M-11)
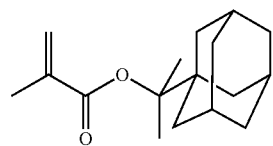
(M-12)
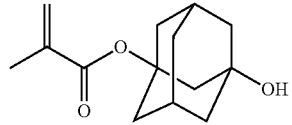
(M-13)
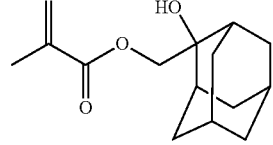
(M-14)
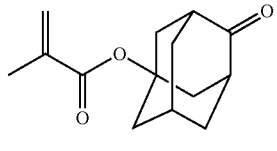
(M-15)
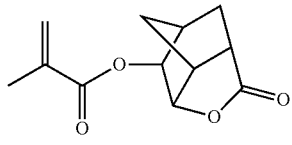
(M-16)
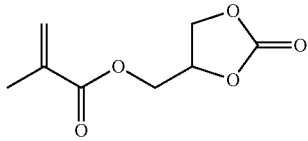
(M-17)
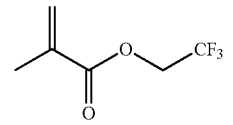
(M-18)
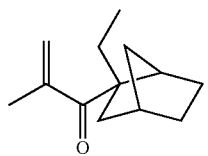
(M-19)

-continued

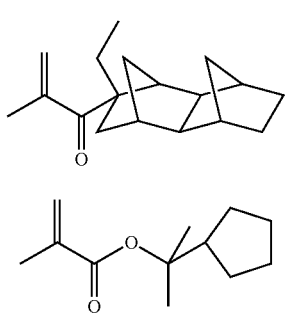

Synthesis Example 1

A monomer solution was prepared by dissolving 28.4 g (35 mol %) of the compound (M-1), 18.0 g (15 mol %) of the compound (M-10) and 53.6 g (50 mol %) of the compound (M-16) in 200 g of 2-butanone, and then adding thereto 2.38 g (3 mol %) of AIBN. A 1,000 mL three-necked flask charged with 100 g of 2-butanone was purged with nitrogen for 30 minutes, and thereafter heated to 80° C. with stirring. The monomer solution prepared was added dropwise using a dropping funnel over 3 hrs. The time when dropwise addition was started was assumed to be a start time point of the polymerization reaction, and the polymerization reaction was carried out for 6 hours. After completion of the polymerization reaction, the polymerization solution was cooled to no greater than 30° C. by water-cooling. The cooled polymerization solution was charged into 2,000 g of methanol, and the white powder precipitated was filtered off. Thus resultant white powder was washed twice with 400 g of methanol, and thereafter filtered off and dried at 50° C. for 17 hrs to obtain a polymer (A-1) in the form of a white powder (yield: 81%). The polymer (A-1) had the Mw of 9,830, the Mw/Mn of 1.47, and the content of fluorine atoms of 0.0%. In addition, as a result of the $^{13}$C-NMR analysis, the polymer (A-1) was verified to be a copolymer including the structural unit derived from the compound (M-1), the structural unit derived from the compound (M-10) and the structural unit derived from the compound (M-16) at each proportion of 33.0:12.9:54.1 (mol %). Furthermore, a molar ratio of the hydrocarbon group (a2) to the hydrocarbon group (a1) in the polymer (A-1) was 0.391.

Synthesis Examples 2 to 19

Polymers (A-2) to (A-11), and (CA-1) to (CA-8) were obtained in a similar manner to Synthesis Example 1 except that each monomer compound of the type and the amount shown in Tables 1-1 and 1-2 was used. Further, the content of the structural unit derived from each monomer and the molar ratio of the hydrocarbon group (a2) to the hydrocarbon group (a1) in each polymer obtained, and measurements of Mw and Mw/Mn ratio of each polymer are shown in Tables 2-1 and 2-2.

TABLE 1-1

| | | Proportion of monomer-charged | | | | | | | | | |
|---|---|---|---|---|---|---|---|---|---|---|---|
| | | | | Structural unit (II) | | | | | | | |
| | | Structural unit (I) | | not containing hydroxyl group | | containing hydroxyl group | | Structural unit (III) | | Other structural unit | |
| | Polymer | monomer | mol % | monomer | mol % | monomer | mol % | monomer | mol % | monomer | mol % |
| Synthesis Example 1 | A-1 | M-1 | 35 | M-10 | 15 | — | — | M-16 | 50 | — | — |
| Synthesis Example 2 | A-2 | M-2 | 45 | M-11 | 10 | — | — | M-16 | 45 | — | — |
| Synthesis Example 3 | A-3 | M-3 | 35 | M-12 | 25 | — | — | M-16 | 40 | — | — |
| Synthesis Example 4 | A-4 | M-5 | 30 | M-10 | 17 | M-13 | 3 | M-16 | 50 | — | — |
| Synthesis Example 5 | A-5 | M-6 | 45 | M-9 | 25 | — | — | M-16 | 20 | — | — |
| | | | | | | | | M-17 | 10 | | |
| Synthesis Example 6 | A-6 | M-7 | 30 | M-10 | 10 | — | — | M-16 | 45 | — | — |
| | | | | M-15 | 15 | | | | | | |
| Synthesis Example 7 | A-7 | M-4 | 40 | M-9 | 15 | M-14 | 3 | M-16 | 42 | — | — |
| Synthesis Example 8 | A-8 | M-3 | 40 | M-15 | 20 | — | — | M-16 | 30 | — | — |
| | | M-8 | 10 | | | | | | | | |
| Synthesis Example 9 | A-9 | M-3 | 45 | M-12 | 15 | — | — | M-16 | 40 | — | — |
| Synthesis Example 10 | A-10 | M-6 | 45 | M-12 | 15 | — | — | M-16 | 40 | — | — |

TABLE 1-2

| | | Proportion of monomer-charged | | | | | | | | |
|---|---|---|---|---|---|---|---|---|---|---|
| | | Structural unit (I) | | Structural unit (II) | | | | Structural unit (III) | | Other structural unit | |
| | | | | not containing hydroxyl group | | containing hydroxyl group | | | | | |
| | Polymer | monomer | mol % | monomer | mol % | monomer | mol % | monomer | mol % | monomer | mol % |
| Synthesis Example 11 | A-11 | M-2 | 45 | M-12 | 15 | — | — | M-16 | 40 | — | — |
| Synthesis Example 12 | CA-1 | M-1 | 50 | — | — | — | — | M-16 | 50 | — | — |
| Synthesis Example 13 | CA-2 | — | — | M-9 | 50 | — | — | M-16 | 50 | — | — |
| Synthesis Example 14 | CA-3 | M-2 | 15 | M-9 | 35 | — | — | M-16 | 50 | — | — |
| Synthesis Example 15 | CA-4 | M-5 | 25 | M-11 | 20 | M-13 | 15 | M-16 | 40 | — | — |
| Synthesis Example 16 | CA-5 | M-3 | 40 | — | — | M-13 | 20 | M-16 | 40 | — | — |
| Synthesis Example 17 | CA-6 | M-1 | 35 | — | — | — | — | M-16 | 50 | M-19 | 15 |
| Synthesis Example 18 | CA-7 | M-1 | 35 | — | — | — | — | M-16 | 50 | M-20 | 15 |
| Synthesis Example 19 | CA-8 | — | — | M-10 | 15 | — | — | M-16 | 50 | M-21 | 35 |

TABLE 2-1

| | | Proportion of Structural unit included | | | | | | | | | Molar ratio of hydrocarbon group (a2) to hydrocarbon group (a1) | | |
|---|---|---|---|---|---|---|---|---|---|---|---|---|---|
| | | Structural unit (I) | | Structural unit (II) | | | | Structural unit (III) | | Other structural unit | | | |
| | | | | not containing hydroxyl group | | containing hydroxyl group | | | | | | | |
| | Polymer | monomer | mol % | monomer | mol % | monomer | mol % | monomer | mol % | monomer | mol % | | Mw | Mw/Mn |
| Synthesis Example 1 | A-1 | M-1 | 33.0 | M-10 | 12.9 | — | — | M-16 | 54.1 | — | — | 0.391 | 9,830 | 1.47 |
| Synthesis Example 2 | A-2 | M-2 | 41.2 | M-11 | 7.1 | — | — | M-16 | 51.7 | — | — | 0.172 | 10,150 | 1.45 |
| Synthesis Example 3 | A-3 | M-3 | 32.4 | M-12 | 25.2 | — | — | M-16 | 42.4 | — | — | 0.778 | 9,020 | 1.48 |
| Synthesis Example 4 | A-4 | M-5 | 27.9 | M-10 | 13.0 | M-13 | 2.6 | M-16 | 56.5 | — | — | 0.559 | 10,040 | 1.51 |
| Synthesis Example 5 | A-5 | M-6 | 41.8 | M-9 | 23.3 | — | — | M-16 | 8.9 | — | — | 0.557 | 9,560 | 1.49 |
| | | | | | | | | M-17 | 26.0 | | | | | |
| Synthesis Example 6 | A-6 | M-7 | 27.1 | M-10 | 8.1 | — | — | M-16 | 51.4 | — | — | 0.793 | 9,250 | 1.50 |
| | | | | M-15 | 13.4 | | | | | | | | | |
| Synthesis Example 7 | A-7 | M-4 | 36.9 | M-9 | 14.0 | M-14 | 2.4 | M-16 | 46.7 | — | — | 0.444 | 9,430 | 1.48 |
| Synthesis Example 8 | A-8 | M-3 | 38.1 | M-15 | 18.1 | — | — | M-16 | 34.6 | — | — | 0.383 | 9,860 | 1.51 |
| | | M-8 | 9.2 | | | | | | | | | | | |
| Synthesis Example 9 | A-9 | M-3 | 43.0 | M-12 | 15.6 | — | — | M-16 | 41.4 | — | — | 0.363 | 9,320 | 1.49 |

TABLE 2-2

| | | Proportion of Structural unit included | | | | | | | | | Molar ratio of hydrocarbon group (a2) to hydrocarbon group (a1) | | |
|---|---|---|---|---|---|---|---|---|---|---|---|---|---|
| | | Structural unit (I) | | Structural unit (II) | | | | Structural unit (III) | | Other structural unit | | | |
| | | | | not containing hydroxyl group | | containing hydroxyl group | | | | | | | |
| | Polymer | monomer | mol % | monomer | mol % | monomer | mol % | monomer | mol % | monomer | mol % | | Mw | Mw/Mn |
| Synthesis Example 10 | A-10 | M-6 | 43.5 | M-12 | 15.3 | — | — | M-16 | 41.2 | — | — | 0.352 | 9,280 | 1.48 |

TABLE 2-2-continued

| | | Proportion of Structural unit included | | | | | | | | Molar ratio of hydrocarbon group (a2) to hydrocarbon group (a1) | | |
|---|---|---|---|---|---|---|---|---|---|---|---|---|
| | | Structural unit (I) | | Structural unit (II) | | | | Structural unit (III) | | Other structural unit | | |
| | | | | not containing hydroxyl group | | containing hydroxyl group | | | | | | |
| | Polymer | monomer | mol % | monomer | mol % | monomer | mol % | monomer | mol % | monomer | mol % | | Mw | Mw/Mn |
| Synthesis Example 11 | A-11 | M-2 | 42.7 | M-12 | 15.7 | — | — | M-16 | 41.6 | — | — | 0.368 | 9,340 | 1.49 |
| Synthesis Example 12 | CA-1 | M-1 | 47.0 | — | — | — | — | M-16 | 53.0 | — | — | — | 10,420 | 1.52 |
| Synthesis Example 13 | CA-2 | — | — | M-9 | 47.6 | — | — | M-16 | 52.4 | — | — | — | 8,670 | 1.46 |
| Synthesis Example 14 | CA-3 | M-2 | 13.5 | M-9 | 34.0 | — | — | M-16 | 52.5 | — | — | 2.519 | 9,340 | 1.49 |
| Synthesis Example 15 | CA-4 | M-5 | 23.1 | M-11 | 18.6 | M-13 | 14.2 | M-16 | 44.1 | — | — | 1.420 | 9,520 | 1.52 |
| Synthesis Example 16 | CA-5 | M-3 | 38.5 | — | — | M-13 | 20.6 | M-16 | 41.9 | — | — | 0.535 | 9,480 | 1.48 |
| Synthesis Example 17 | CA-6 | M-1 | 33.4 | — | — | — | — | M-16 | 53.5 | M-19 | 13.1 | 0.392 | 9,740 | 1.46 |
| Synthesis Example 18 | CA-7 | M-1 | 33.6 | — | — | — | — | M-16 | 53.4 | M-20 | 13.0 | 0.387 | 9,910 | 1.48 |
| Synthesis Example 19 | CA-8 | — | — | M-10 | 14.1 | — | — | M-16 | 50.7 | M-21 | 35.2 | 0.401 | 9,740 | 1.49 |

Synthesis of Fluorine Atom-Containing Polymer

Synthesis Example 20

A monomer solution was prepared by dissolving 35.8 g (70 mol %) of the compound (M-2) and 14.2 g (30 mol %) of the compound (M-18) in 100 g of 2-butanone, and then adding thereto 2.34 g of dimethyl 2,2'-azobisisobutyrate. A 500 mL three-necked flask charged with 20 g of 2-butanone was purged with nitrogen for 30 minutes, and thereafter heated to 80° C. with stirring. The monomer solution prepared was added dropwise using a dropping funnel over 3 hrs. The time when dropwise addition was started was assumed to be a start time point of the polymerization reaction, and the polymerization reaction was carried out for 6 hours. After completion of the polymerization reaction, the polymerization solution was cooled to no greater than 30° C. by water-cooling. The reaction solution was transferred to a 1 L separatory funnel, then homogenously diluted with 200 g of n-hexane, and 800 g of methanol was charge thereto followed by mixing. Subsequently, 20 g of distilled water was charged, and the mixture was further stirred and allowed to stand for 30 min. Thereafter, the under layer was recovered to give a polymer (C-1) in a propylene glycol monomethyl ether acetate solution (yield: 60%). The polymer (C-1) had the Mw of 6,000, and the Mw/Mn of 1.45. In addition, as a result of the $^{13}$C-NMR analysis, the polymer (C-1) was verified to be a copolymer including the structural unit derived from the compound (M-2) and the structural unit derived from the compound (M-18) at each proportion of 69:31 (mol %).

Preparation of Radiation-Sensitive Resin Composition

The acid generating agent (B), the acid diffusion control agent and the solvent used in preparation of the radiation-sensitive resin compositions are shown below.

(B) Acid Generating Agent

B-1: triphenylsulfonium 6-adamantylcarbonyloxy-1,1,2,2-tetrafluorohexanesulfonate (compound represented by the following formula (B-1))

B-2: triphenylsulfonium 2-adamantyl-1,1-difluoroethanesulfonate (compound represented by the following formula (B-2))

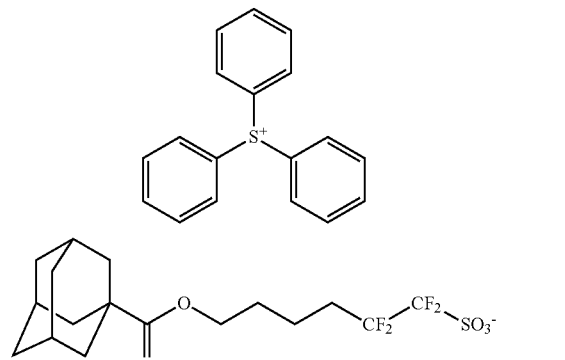

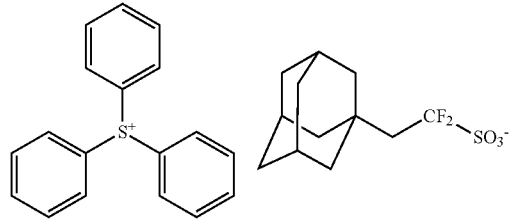

Acid Diffusion Control Agent

D-1: t-pentyl 4-hydroxypyridine-N-carboxylate (compound represented by the following formula (D-1))

D-2: triphenylsulfonium salicylate (compound represented by the following formula (D-2))

D-3: triphenylsulfonium camphorsulfonate (compound represented by the following formula (D-3))

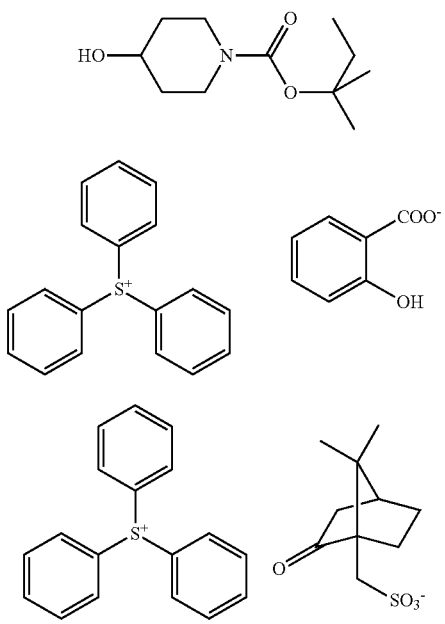

Solvent

E-1: propylene glycol monomethyl ether acetate

E-2: cyclohexanone

E-3: γ-butyrolactone

Example 1

A radiation-sensitive resin composition (J-1) was prepared by mixing 100 parts by mass of the polymer (A-1), 3 parts by mass of the polymer (C-1), 11 parts by mass of the acid generating agent (B-1), 4.5 parts by mass of the acid diffusion control agent (D-1), and as the solvent 1,620 parts by mass of (E-1), 700 parts by mass of (E-2) and 30 parts by mass of (E-3), and then filtering the obtained mixture through a filter having a pore size of 0.2 μm.

Examples 2 to 13, and Synthesis Examples 21 to 28

Radiation-sensitive resin compositions were prepared in a similar manner to Example 1 except that each component of the type and the amount shown in Tables 3-1 and 3-2 was used.

TABLE 3-1

| | Radiation-sensitive resin composition | (A) Component | | (B) Acid generating agent | | Fluorine atom-containing polymer | | Acid diffusion control agent | | Solvent | |
|---|---|---|---|---|---|---|---|---|---|---|---|
| | | type | parts by mass | type | parts by mass | type | parts by mass | type | parts by mass | type | parts by mass |
| Example 1 | J-1 | A-1 | 100 | B-1 | 11 | C-1 | 3 | D-2 | 4.5 | E-1/E-2/E-3 | 1,620/700/30 |
| Example 2 | J-2 | A-1 | 100 | B-2 | 8.5 | C-1 | 3 | D-3 | 4.5 | E-1/E-2/E-3 | 1,620/700/31 |
| Example 3 | J-3 | A-1 | 100 | B-1 | 11 | C-1 | 3 | D-1 | 1 | E-1/E-2/E-3 | 1,620/700/32 |
| Example 4 | J-4 | A-2 | 100 | B-1 | 11 | C-1 | 3 | D-2 | 4.5 | E-1/E-2/E-3 | 1,620/700/33 |
| Example 5 | J-5 | A-3 | 100 | B-1 | 11 | C-1 | 3 | D-2 | 4.5 | E-1/E-2/E-3 | 1,620/700/34 |
| Example 6 | J-6 | A-4 | 100 | B-1 | 11 | C-1 | 3 | D-2 | 4.5 | E-1/E-2/E-3 | 1,620/700/35 |
| Example 7 | J-7 | A-5 | 100 | B-1 | 11 | C-1 | 3 | D-2 | 4.5 | E-1/E-2/E-3 | 1,620/700/36 |
| Example 8 | J-8 | A-6 | 100 | B-1 | 11 | C-1 | 3 | D-2 | 4.5 | E-1/E-2/E-3 | 1,620/700/37 |
| Example 9 | J-9 | A-7 | 100 | B-1 | 11 | C-1 | 3 | D-2 | 4.5 | E-1/E-2/E-3 | 1,620/700/38 |
| Example 10 | J-10 | A-8 | 100 | B-1 | 11 | C-1 | 3 | D-2 | 4.5 | E-1/E-2/E-3 | 1,620/700/39 |
| Example 11 | J-11 | A-9 | 100 | B-2 | 8.5 | C-1 | 3 | D-3 | 4.5 | E-1/E-2/E-3 | 1,620/700/40 |
| Example 12 | J-12 | A-10 | 100 | B-2 | 8.5 | C-1 | 3 | D-3 | 4.5 | E-1/E-2/E-3 | 1,620/700/41 |
| Example 13 | J-13 | A-11 | 100 | B-2 | 8.5 | C-1 | 3 | D-3 | 4.5 | E-1/E-2/E-3 | 1,620/700/42 |

TABLE 3-2

| | Radiation-sensitive resin composition | (A) Component | | (B) Acid generating agent | | Fluorine atom-containing polymer | | Acid diffusion control agent | | Solvent | |
|---|---|---|---|---|---|---|---|---|---|---|---|
| | | type | parts by mass | type | parts by mass | type | parts by mass | type | parts by mass | type | parts by mass |
| Synthesis Example 21 | CJ-1 | CA-1 | 100 | B-1 | 11 | C-1 | 3 | D-2 | 4.5 | E-1/E-2/E-3 | 1,620/700/43 |
| Synthesis Example 22 | CJ-2 | CA-2 | 100 | B-1 | 11 | C-1 | 3 | D-2 | 4.5 | E-1/E-2/E-3 | 1,620/700/44 |
| Synthesis Example 23 | CJ-3 | CA-3 | 100 | B-1 | 11 | C-1 | 3 | D-2 | 4.5 | E-1/E-2/E-3 | 1,620/700/45 |
| Synthesis Example 24 | CJ-4 | CA-4 | 100 | B-1 | 11 | C-1 | 3 | D-2 | 4.5 | E-1/E-2/E-3 | 1,620/700/46 |

TABLE 3-2-continued

|  | Radiation-sensitive resin composition | (A) Component | | (B) Acid generating agent | | Fluorine atom-containing polymer | | Acid diffusion control agent | | Solvent | |
|---|---|---|---|---|---|---|---|---|---|---|---|
|  |  | type | parts by mass | type | parts by mass | type | parts by mass | type | parts by mass | type | parts by mass |
| Synthesis Example 25 | CJ-5 | CA-5 | 100 | B-1 | 11 | C-1 | 3 | D-2 | 4.5 | E-1/E-2/E-3 | 1,620/700/47 |
| Synthesis Example 26 | CJ-6 | CA-6 | 100 | B-1 | 11 | C-1 | 3 | D-2 | 4.5 | E-1/E-2/E-3 | 1,620/700/48 |
| Synthesis Example 27 | CJ-7 | CA-7 | 100 | B-1 | 11 | C-1 | 3 | D-2 | 4.5 | E-1/E-2/E-3 | 1,620/700/49 |
| Synthesis Example 28 | CJ-8 | CA-8 | 100 | B-1 | 11 | C-1 | 3 | D-2 | 4.5 | E-1/E-2/E-3 | 1,620/700/50 |

Formation of Resist Pattern

Example 14

On a 12-inch silicon wafer which had been provided with an underlayer antireflective film (ARC66, manufactured by Nissan Chemical Industries, Ltd.) having a film thickness of 105 nm, a coating film having a film thickness of 100 nm was provided using the radiation-sensitive resin composition prepared in Example 1, and then soft baking was carried out at 80° C. for 60 sec. Next, the coating film was exposed through a mask pattern by which a pattern provided after reduction projection had a dot of 55 nm and a pitch of 110 nm under conditions involving NA of 1.3, iNA of 1.27 and a ratio of 0.800, with Quadrupole, using an ArF excimer laser liquid immersion scanner (NSR S610C, manufactured by NIKON Corporation). After the exposure, post-exposure baking (PEB) was carried out at 100° C. for 60 sec. Subsequently, the film was developed with butyl acetate at 23° C. for 30 sec, and subjected to a rinse treatment with a 4-methyl-2-pentanol solvent for 10 sec and dried to obtain a resist pattern. In accordance with this procedure, an exposure dose at which the area through a mask pattern, which yields a pattern with a dot of 55 nm and a pitch of 110 nm after reduction projection, forms a hole pattern with a diameter of 55 nm was defined as an optimum exposure dose (Eop). It is to be noted that a scanning electron microscope (CG-4000, manufactured by Hitachi High-Technologies Corporation) was used for line-width measurement.

Examples 15 to 26, and Comparative Examples 1 to 8

Resist patterns were formed in a similar manner to Example 14 except that each radiation-sensitive resin composition prepared in Examples and Comparative Examples was used in Example 14, and the temperature of PEB was as shown in Tables 4-1 and 4-2.

Evaluations

Film loss amount of the resist coating film was evaluated on a resist coating film formed according to the following method. In addition, CDU, MEEF, resolution and etching resistance were evaluated on the resist pattern formed in Examples 14 to 26 and Comparative Examples 1 to 7 according to the following method. The results are shown in Tables 4-1 and 4-2.

Film Loss Amount

First, an 8-inch silicon wafer which had been provided with an underlayer antireflective film (ARC29A, manufactured by Brewer Science, Inc.) having an film thickness of 77 nm, a coating film having an initial film thickness of 150 nm was provided using each of the radiation-sensitive resin compositions prepared in Examples and Comparative Examples, and then soft baking (SB) was carried out at 90° C. for 60 sec. Next, the entire face of the wafer was exposed at the optimum exposure dose (Eop) (unit: $mJ/cm^2$) that allows a hole pattern having a diameter of 55 nm to be formed, without using a mask under conditions involving NA of 0.78 and sigma of 0.90, with Conventional, using an ArF excimer laser scanner (NSR S306C, manufactured by NIKON Corporation). After the exposure, PEB was carried out at a temperature shown in Tables 4-1 and 4-2 for 60 sec. Subsequently, the film was developed with butyl acetate at 23° C. for 30 sec, and subjected to a rinse treatment with 4-methyl-2-pentanol for 10 sec and dried. The film thickness of remaining coating films after completion of a series of process was measured, and a value obtained by reducing the remaining film thickness from the initial film thickness was defined as a film loss amount (unit: nm). It is to be noted that the film thickness was measured using an optical interferometric film thickness measurement system ("Lambda Ace", manufactured by Dainippon Screen Mfg. Co., Ltd.). With respect to the determined film loss amount, evaluation was made as: "A" when the value was less than 20 nm; and "B" when the value was no less than 20 nm. The values of the film loss amount obtained and the evaluations are shown in Tables 4-1 and 4-2 below.

CDU (Critical Dimension Uniformity)

A total of 30 hole patterns having a diameter of 55 nm formed at the Eop as defined above in pattern formation of each of Examples and Comparative Examples were subjected to line-width measurement, and an average deviation of the measurement values obtained in the line-width measurement of the total of 30 hole patterns was calculated. Thus, CDU was determined by multiplication of the average deviation by three. With respect to the CDU values, evaluation was made as: "A" when the CDU value was less than 2.5; "B" when the CDU value was no less than 2.5 and less than 3.0; and "C" when the CDU value was no less than 3.0. The values of CDU obtained and the evaluations are shown in Tables 4-1 and 4-2 below.

MEEF (Mask Error Enhancement Factor)

In a similar manner to resist pattern formation of each of Examples and Comparative Examples, holes were formed on the resist coating film using a portion of a mask pattern that yield a dot diameter of 51 nm, 53 nm, 55 nm, 57 nm or 59 nm of the pattern after reduction projection, at the Eop as defined above. The diameters (nm) were plotted along the ordinate with respect to the size (nm) of the mask pattern along abscissa. A straight line was obtained, and the slope of the straight line was determined as MEEF. The MEEF value (slope of the straight line) more approximate to 1 indicates more favorable mask reproducibility. With respect to the MEEF values, evaluation was made as: "A" when the MEEF value was less than 3.5; "B" when the MEEF value was no less than 3.5 and less than 4.5; and "C" when the MEEF value was no less than 4.5. The MEEF values obtained and the evaluations are shown in Tables 4-1 and 4-2 below.

Resolution

In resist pattern formation of each of the Examples and Comparative Examples, an exposure was carried out through a mask pattern that yield a pattern having a dot of 55 nm and a pitch of 110 nm after the reduction projection at an exposure dose that is no less than the Eop. The minimum dimension of the hole pattern obtained with an increasing of the exposure dose was determined, which was employed for evaluation of the resolution (unit: nm). Evaluation was made as: "A" when the minimum dimension was less than 48 nm; and "B" when the minimum dimension was no less than 48 nm. The resolutions obtained and the evaluations are shown in Tables 4-1 and 4-2 below.

Etching Resistance

An organic antireflective film-forming agent (ARC66, manufactured by Nissan Chemical Industries, Ltd.) was coated on the surface of a wafer to provide an organic antireflective film having a film thickness of 105 nm. Each of the radiation-sensitive resin compositions of Examples and Synthesis Examples was coated on the surface of the substrate by spin coating using CLEAN TRACK (ACT12, manufactured by Tokyo Electron Limited), and then soft baking was carried out on a to hot plate at 90° C. for 60 sec to form a resist coating film having a film thickness of 0.10 μm. Subsequently, the surface of the wafer was exposed at an exposure dose corresponding to three times the optimum exposure dose (Eop) that leads to formation of the hole pattern having a diameter of 55 nm on the resist coating film on the substrate. After the exposure, PEB was carried out at a temperature shown in Tables 4-1 and 4-2 for 60 sec. Subsequently, the film was developed with butyl acetate at 23° C. for 30 sec, and subjected to a rinse treatment with 4-methyl-2-pentanol for 10 sec and dried. Thereafter, each etching rate was measured on the resist coating film before the exposure, and on the resist coating film after completion of a series of process until the rinse treatment finished. The difference between the etching rate of the resist coating film after completion of the series of process and the etching rate of the resist coating film before subjecting to exposure was determined. Evaluation was made as: "A" when the difference accounted for no greater than 10% of the etching rate of the resist coating film before subjecting to the exposure; and as "B" when the difference accounted for no greater than 10%. The values of the difference of the etching rates obtained and the evaluations are shown in Tables 4-1 and 4-2 below. The measurement of the etching rate of the resist coating film was carried out using an etching system (manufactured by Telius, Tokyo Electron Limited), under the following etching conditions.

flow rate of $CF_4$ gas: 150 sccm
chamber pressure: 100 mTorr
power: 300 W (upper)/300 W (bottom)
time: 20 sec

TABLE 4-1

| | Radiation-sensitive resin composition | (A) Component | Temperature of PEB (° C.) | Eop (mJ/cm$^2$) | Film loss amount value (nm) | Film loss amount evaluation | CDU value | CDU evaluation | MEEF value | MEEF evaluation | Resolution value (nm) | Resolution evaluation | Etching resistance value (%) | Etching resistance evaluation |
|---|---|---|---|---|---|---|---|---|---|---|---|---|---|---|
| Example 14 | J-1 | A-1 | 100 | 18 | 17 | A | 2.0 | A | 3.7 | B | 38 | A | 8.5 | A |
| Example 15 | J-2 | A-1 | 100 | 25.5 | 17 | A | 1.9 | A | 3.9 | B | 37 | A | 8.5 | A |
| Example 16 | J-3 | A-1 | 100 | 18.5 | 17 | A | 2.3 | A | 3.8 | B | 41 | A | 8.5 | A |
| Example 17 | J-4 | A-2 | 85 | 19 | 16 | A | 2.1 | A | 3.4 | A | 39 | A | 8.0 | A |
| Example 18 | J-5 | A-3 | 80 | 16.5 | 18 | A | 2.2 | A | 4.0 | B | 40 | A | 7.5 | A |
| Example 19 | J-6 | A-4 | 95 | 17.5 | 16 | A | 2.5 | B | 4.2 | B | 41 | A | 8.0 | A |
| Example 20 | J-7 | A-5 | 85 | 18.5 | 19 | A | 2.2 | A | 4.3 | B | 46 | A | 7.5 | A |
| Example 21 | J-8 | A-6 | 80 | 15.5 | 19 | A | 1.9 | A | 4.1 | B | 40 | A | 7.0 | A |
| Example 22 | J-9 | A-7 | 105 | 17 | 17 | A | 2.8 | B | 3.3 | A | 44 | A | 8.5 | A |
| Example 23 | J-10 | A-8 | 85 | 18.5 | 17 | A | 2.3 | A | 3.4 | A | 40 | A | 9.0 | A |
| Example 24 | J-11 | A-9 | 85 | 23 | 17 | A | 2.0 | A | 3.6 | B | 38 | A | 8.0 | A |
| Example 25 | J-12 | A-10 | 85 | 24 | 17 | A | 2.0 | A | 3.4 | A | 38 | A | 8.0 | A |
| Example 26 | J-13 | A-11 | 95 | 21.5 | 17 | A | 2.1 | A | 3.8 | B | 37 | A | 8.0 | A |

TABLE 4-2

| | Radiation-sensitive resin composition | (A) Component | Temperature of PEB (° C.) | Eop (mJ/cm$^2$) | Film loss amount value (nm) | Film loss amount evaluation | CDU value | CDU evaluation | MEEF value | MEEF evaluation | Resolution value (nm) | Resolution evaluation | Etching resistance value (%) | Etching resistance evaluation |
|---|---|---|---|---|---|---|---|---|---|---|---|---|---|---|
| Comparative Example 1 | CJ-1 | CA-1 | 105 | 18.5 | 15 | A | 2.2 | A | 3.5 | B | 39 | A | 14.5 | B |
| Comparative Example 2 | CJ-2 | CA-2 | 115 | | | | resolution of 55 nm hole pattern failed | | | | | | | 6.0 | A |
| Comparative Example 3 | CJ-3 | CA-3 | 105 | 20.5 | 26 | B | 3.8 | C | 5.1 | C | 53 | B | 7.0 | A |

TABLE 4-2-continued

| | Radiation-sensitive resin composition | (A) Component | Temperature of PEB (° C.) | Eop (mJ/cm²) | Film loss amount | | CDU | | MEEF | | Resolution | | Etching resistance | |
|---|---|---|---|---|---|---|---|---|---|---|---|---|---|---|
| | | | | | value (nm) | evaluation | value | evaluation | value | evaluation | value (nm) | evaluation | value (%) | evaluation |
| Comparative Example 4 | CJ-4 | CA-4 | 90 | 19.5 | 22 | B | 3.2 | C | 4.9 | C | 49 | B | 7.5 | A |
| Comparative Example 5 | CJ-5 | CA-5 | 90 | 20 | 22 | B | 3.1 | C | 4.2 | B | 46 | A | 8.5 | A |
| Comparative Example 6 | CJ-6 | CA-6 | 100 | 17 | 17 | A | 2.3 | A | 3.7 | B | 40 | A | 11.5 | B |
| Comparative Example 7 | CJ-7 | CA-7 | 100 | 20 | 19 | A | 2.8 | B | 3.9 | B | 49 | B | 8.0 | A |
| Comparative Example 8 | CJ-8 | CA-8 | 80 | 17 | 18 | A | 2.7 | B | 4.7 | C | 48 | B | 8.5 | A |

As is clear from Tables 4-1 and 4-2, according to the resist pattern-forming method of the embodiment of the present invention, both superior etching resistance and inhibition of the film loss of a resist coating film can be achieved, and a resist pattern superior in lithography characteristics such as CDU, MEEF, resolution can be obtained.

According to the embodiment of the present invention, a resist pattern-forming method capable of achieving both superior etching resistance and inhibition of the film loss of a resist coating film, and being superior in lithography characteristics such as CDU can be provided, and also provided is a radiation-sensitive resin composition suited for the resist pattern-forming method.

Obviously, numerous modifications and variations of the present invention are possible in light of the above teachings. It is therefore to be understood that within the scope of the appended claims, the invention may be practiced otherwise than as specifically described herein.

The invention claimed is:

1. A resist pattern-forming method comprising:
   forming a resist coating film using a radiation-sensitive resin composition;
   exposing the resist coating film; and
   developing the exposed resist coating film using a developer solution comprising no less than 80% by mass of an organic solvent,
   the radiation-sensitive resin composition comprising:
   a fluorine atom-containing polymer;
   a polymer component other than the fluorine atom-containing polymer, the polymer component comprising a polymer having an acid-labile group; and
   a radiation-sensitive acid generator,
   the polymer component comprising, in an identical polymer or different polymers, a first structural unit comprising a first hydrocarbon group, and a second structural unit comprising a second hydrocarbon group,
   the first hydrocarbon group being an unsubstituted or substituted branched chain group having no greater than 8 carbon atoms or an unsubstituted or substituted monocyclic alicyclic group having 3 to 8 ring carbon atoms,
   the second hydrocarbon group having an adamantane skeleton,
   a molar ratio of the second hydrocarbon group to the first hydrocarbon group being less than 1, and
   a proportion of a structural unit having a hydroxyl group in the polymer component to a total amount of structural units in the polymer component being less than 5 mol %,
   wherein an amount of the fluorine atom-containing polymer is 1 to 20 parts by mass with respect to 100 parts by mass of the polymer component.

2. The resist pattern-forming method according to claim 1, wherein the first structural unit is represented by formula (1), and the second structural unit is represented by formula (2):

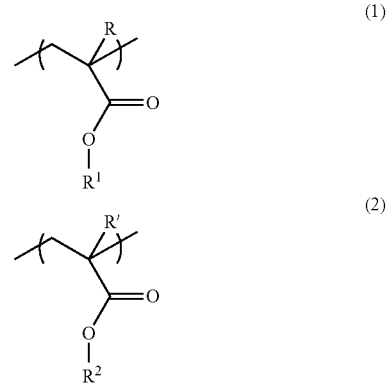

wherein, in the formulae (1) and (2), R and R' each independently represent a hydrogen atom, a fluorine atom, a methyl group or a trifluoromethyl group; $R^1$ represents a monovalent group which is the first hydrocarbon group; and $R^2$ represents a monovalent group which is the second hydrocarbon group, and $R^1$ and $R^2$ each independently do not have or have a hydroxyl group, a carbonyl group, a cyano group, a nitro group, a sulfonamide group or a combination thereof.

3. The resist pattern-forming method according to claim 2, wherein $R^1$ in the formula (1) represents an acid-labile group.

4. The resist pattern-forming method according to claim 2, wherein $R^2$ in the formula (2) represents a group each represented by formulae (2-1) to (2-4), an acid-labile group or a combination thereof:

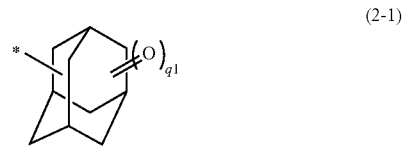

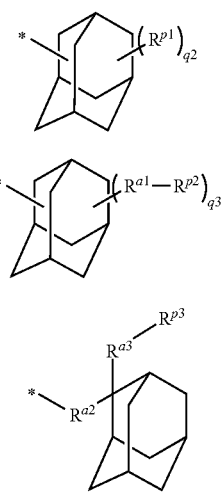

wherein, in the formulae (2-1) to (2-4), $R^{p1}$, $R^{p2}$ and $R^{p3}$ each independently represent a hydroxyl group, a cyano group, a nitro group or a sulfonamide group; $R^{a1}$ and $R^{a2}$ each independently represent a methylene group or an alkylene group having 2 to 10 carbon atoms; $R^{a3}$ represents a single bond, a methylene group or an alkylene group having 2 to 10 carbon atoms; q1 is an integer of 1 to 6; and q2 and q3 are each independently an integer of 1 to 15, wherein in a case where $R^{p1}$, $R^{p2}$ and $R^{a1}$ are each present in a plurality of number, a plurality of $R^{p1}$s are each identical or different, a plurality of $R^{p2}$s are each identical or different and a plurality of $R^{a1}$s are each identical or different, and wherein * denotes a binding site to the ester group in the formula (2).

5. The resist pattern-forming method according to claim 1, wherein a molar ratio of the second hydrocarbon group to the first hydrocarbon group is no less than 0.1 and no greater than 0.9.

6. The resist pattern-forming method according to claim 1, wherein the second hydrocarbon group has a hydroxyl group, a carbonyl group or a combination thereof.

7. The resist pattern-forming method according to claim 1, wherein the polymer component further comprises a structural unit having a lactone group, a cyclic carbonate group or a combination thereof.

8. The resist pattern-forming method according to claim 1, wherein a proportion of the acid-labile group in the first hydrocarbon group and the second hydrocarbon group to a total of the first hydrocarbon group and the second hydrocarbon group is no less than 50 mol %.

9. The resist pattern-forming method according to claim 1, wherein the radiation-sensitive acid generator is represented by formula (B-1):

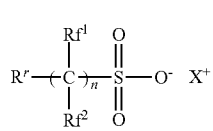

wherein, in the formula (B-1), $Rf^1$ and $Rf^2$ each independently represent a hydrogen atom, a fluorine atom, or a fluorinated alkyl group having 1 to 4 carbon atoms; n is an integer of 1 to 3, wherein any case in which $Rf^1$ and $Rf^2$ bonded to carbon at an α-position of the sulfonate group both represent a hydrogen atom is excluded, and in a case where $Rf^1$ and $Rf^2$ are each present in a plurality of number, a plurality of $Rf^1$s are each identical or different and a plurality of $Rf^2$s are each identical or different; $R^1$ represents a monovalent organic group having 3 to 20 carbon atoms and having an alicyclic structure; and $X^+$ represents a monovalent cation.

10. The resist pattern-forming method according to claim 9, wherein W in the formula (B-1) is represented by formula (i):

wherein, in the formula (i), A represents a linking group having a valency of (m+1); m is an integer of 1 to 3; and $R^{r1}$ represents a monovalent organic group having 3 to 20 carbon atoms and having an alicyclic structure.

11. A radiation-sensitive resin composition comprising:
a fluorine atom-containing polymer;
a polymer component other than the fluorine atom-containing polymer, the polymer component comprising a polymer having an acid-labile group; and
a radiation-sensitive acid generator,
the polymer component comprising, in an identical polymer or different polymers, a first structural unit comprising a first hydrocarbon group, and a second structural unit comprising a second hydrocarbon group,
the first hydrocarbon group being an unsubstituted or substituted branched chain group having no greater than 8 carbon atoms or an unsubstituted or substituted monocyclic alicyclic group having 3 to 8 ring carbon atoms,
the second hydrocarbon group having an adamantane skeleton,
a molar ratio of the second hydrocarbon group to the first hydrocarbon group being less than 1,
a proportion of a structural unit having a hydroxyl group in the polymer component to a total of structural units in the polymer component being less than 5 mol %, and
the radiation-sensitive resin composition being for use in a resist pattern-forming method carried out using a developer solution comprising no less than 80% by mass of an organic solvent,
wherein an amount of the fluorine atom-containing polymer is 1 to 20 parts by mass with respect to 100 parts by mass of the polymer component.

12. The resist pattern-forming method according to claim 1, wherein the amount of the fluorine atom-containing polymer is 3 to 20 parts by mass with respect to 100 parts by mass of the polymer component.

13. The radiation-sensitive resin composition according to claim 11, wherein the amount of the fluorine atom-containing polymer is 3 to 20 parts by mass with respect to 100 parts by mass of the polymer component.

14. The radiation-sensitive resin composition according to claim 11, wherein the first structural unit is represented by formula (1), and the second structural unit is represented by formula (2):

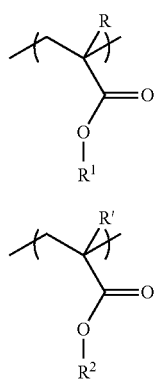

(1)

(2)

wherein, in the formulae (1) and (2), R and R' each independently represent a hydrogen atom, a fluorine atom, a methyl group or a trifluoromethyl group; $R^1$ represents a monovalent group which is the first hydrocarbon group; and $R^2$ represents a monovalent group which is the second hydrocarbon group, and $R^1$ and $R^2$ each independently do not have or have a hydroxyl group, a carbonyl group, a cyano group, a nitro group, a sulfonamide group or a combination thereof.

15. The radiation-sensitive resin composition according to claim 14, wherein $R^1$ in the formula (1) represents an acid-labile group.

16. The radiation-sensitive resin composition according to claim 14, wherein $R^2$ in the formula (2) represents a group each represented by formulae (2-1) to (2-4), an acid-labile group or a combination thereof:

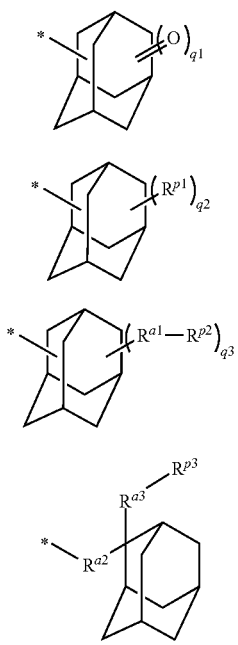

(2-1)

(2-2)

(2-3)

(2-4)

wherein, in the formulae (2-1) to (2-4),
$R^{p1}$, $R^{p2}$ and $R^{p3}$ each independently represent a hydroxyl group, a cyano group, a nitro group or a sulfonamide group; $R^{a1}$ and $R^{a2}$ each independently represent a methylene group or an alkylene group having 2 to 10 carbon atoms; $R^{a3}$ represents a single bond, a methylene group or an alkylene group having 2 to 10 carbon atoms; q1 is an integer of 1 to 6; and q2 and q3 are each independently an integer of 1 to 15, wherein in a case where $R^{p1}$, $R^{p2}$ and $R^{a1}$ are each present in a plurality of number, a plurality of $R^{p1}$s are each identical or different, a plurality of $R^{p2}$s are each identical or different and a plurality of $R^{a1}$ s are each identical or different, and wherein * denotes a binding site to the ester group in the formula (2).

17. The radiation-sensitive resin composition according to claim 11, wherein a molar ratio of the second hydrocarbon group to the first hydrocarbon group is no less than 0.1 and no greater than 0.9.

18. The radiation-sensitive resin composition according to claim 11, wherein the second hydrocarbon group has a hydroxyl group, a carbonyl group or a combination thereof.

19. The radiation-sensitive resin composition according to claim 11, wherein the polymer component further comprises a structural unit having a lactone group, a cyclic carbonate group or a combination thereof.

20. The radiation-sensitive resin composition according to claim 11, wherein a proportion of the acid-labile group in the first hydrocarbon group and the second hydrocarbon group to a total of the first hydrocarbon group and the second hydrocarbon group is no less than 50 mol %.

21. The radiation-sensitive resin composition according to claim 11, wherein the radiation-sensitive acid generator is represented by formula (B-1):

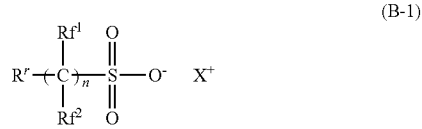

(B-1)

wherein, in the formula (B-1), $Rf^1$ and $Rf^2$ each independently represent a hydrogen atom, a fluorine atom, or a fluorinated alkyl group having 1 to 4 carbon atoms; n is an integer of 1 to 3, wherein any case in which $Rf^1$ and $Rf^2$ bonded to carbon at an α-position of the sulfonate group both represent a hydrogen atom is excluded, and in a case where $Rf^1$ and $Rf^2$ are each present in a plurality of number, a plurality of $Rf^1$ s are each identical or different and a plurality of $Rf^2$s are each identical or different; $R^r$ represents a monovalent organic group having 3 to 20 carbon atoms and having an alicyclic structure; and $X^+$ represents a monovalent cation.

22. The radiation-sensitive resin composition according to claim 21, wherein $R^r$ in the formula (B-1) is represented by formula (i):

(i)

wherein, in the formula (i), A represents a linking group having a valency of (m+1); m is an integer of 1 to 3; and $R^{r1}$ represents a monovalent organic group having 3 to 20 carbon atoms and having an alicyclic structure.

* * * * *